(12) United States Patent
Chen et al.

(10) Patent No.: US 9,211,003 B1
(45) Date of Patent: Dec. 15, 2015

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Cheng-Chieh Weng, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 14/583,988

(22) Filed: Dec. 29, 2014

(51) Int. Cl.
*A47B 57/58* (2006.01)

(52) U.S. Cl.
CPC ..................... *A47B 57/585* (2013.01)

(58) Field of Classification Search
CPC .................. A47B 88/10; A47B 88/16
USPC .................. 312/319.1, 333; 384/21
See application file for complete search history.

(56) References Cited

U.S. PATENT DOCUMENTS

| | | | |
|---|---|---|---|
| 6,685,288 B1 * | 2/2004 | MacMillan ............ | A47B 88/10 312/334.44 |
| 6,997,529 B1 * | 2/2006 | Chen ..................... | A47B 88/10 312/334.44 |
| 7,413,269 B2 * | 8/2008 | Chen ..................... | A47B 88/10 312/333 |
| 8,240,790 B2 * | 8/2012 | Zhang .................. | H05K 7/1489 312/334.44 |
| 2009/0096340 A1 * | 4/2009 | Chen ..................... | A47B 88/16 312/334.46 |
| 2012/0027325 A1 * | 2/2012 | Lacarra ................. | A47B 88/10 384/18 |
| 2012/0043872 A1 * | 2/2012 | Enos ..................... | A47B 88/10 312/332.1 |
| 2012/0097689 A1 * | 4/2012 | Grainger ............... | A47B 88/10 220/694 |
| 2013/0039608 A1 * | 2/2013 | Chen ..................... | A47B 88/10 384/20 |
| 2013/0259411 A1 * | 10/2013 | Judge ..................... | F16C 29/04 384/49 |
| 2013/0328470 A1 * | 12/2013 | Yoshizumi ............. | A47B 88/16 312/334.47 |
| 2013/0334766 A1 * | 12/2013 | Okamoto ............ | A47B 88/0466 271/145 |

* cited by examiner

*Primary Examiner* — Hanh V Tran
(74) *Attorney, Agent, or Firm* — Rosenberg, Klein & Lee

(57) ABSTRACT

A slide rail assembly includes a first rail, a second rail, and a third rail. The second rail and the third rail can be longitudinally displaced relative to the first rail. The second rail has a longitudinally extending body. The third rail includes a first longitudinal portion, a second longitudinal portion, and a slope portion connected between the first and the second longitudinal portions. The longitudinally extending body of the second rail has a side surface, and the second longitudinal portion of the third rail has a side surface. The two side surfaces lie on substantially the same reference plane due to the slope portion.

20 Claims, 20 Drawing Sheets

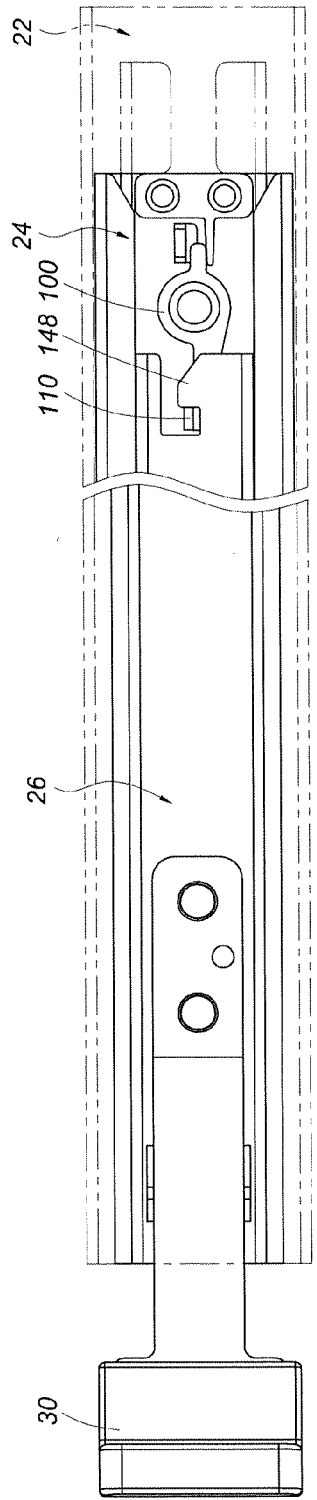
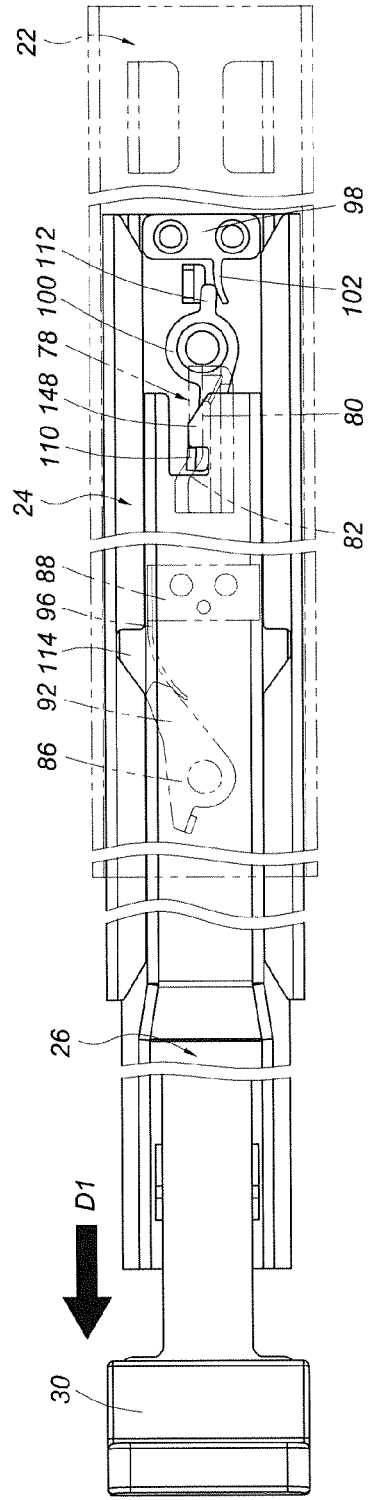

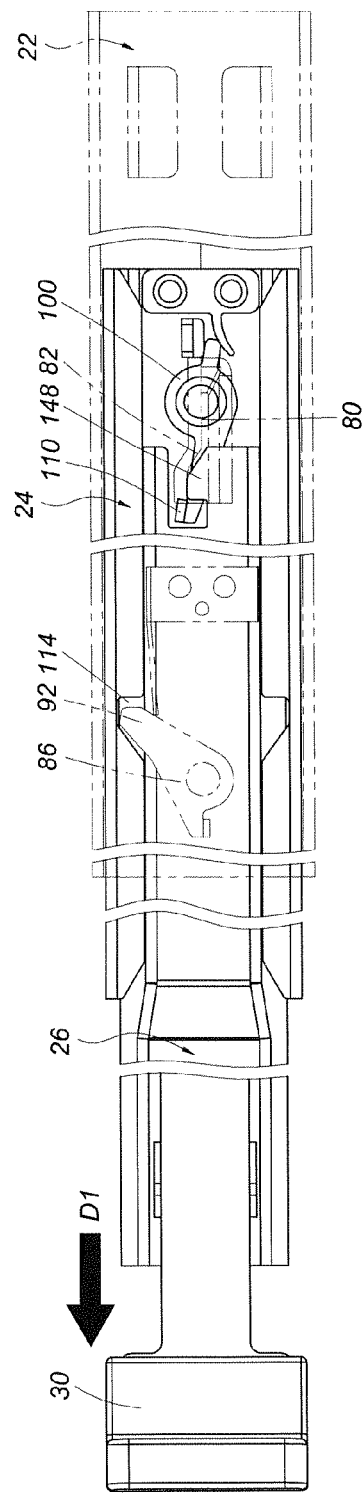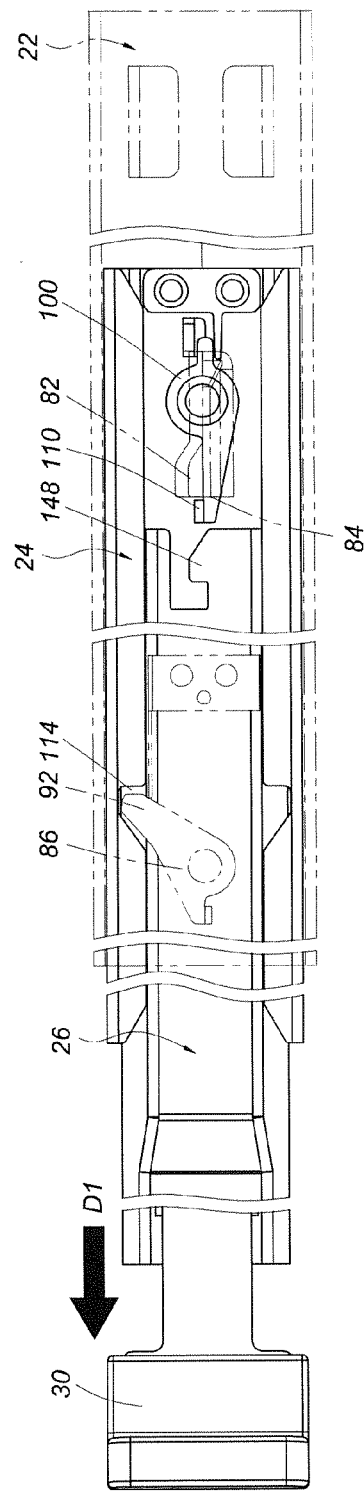

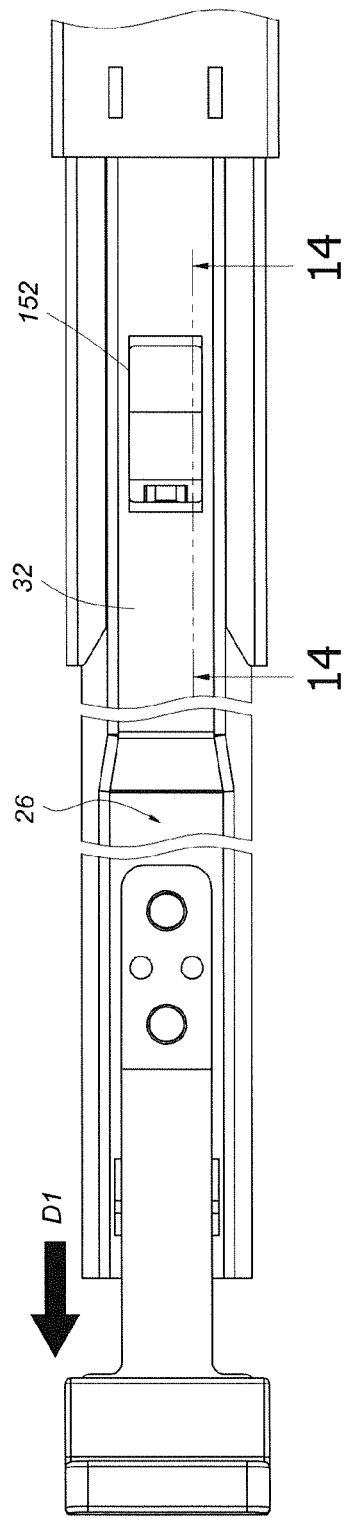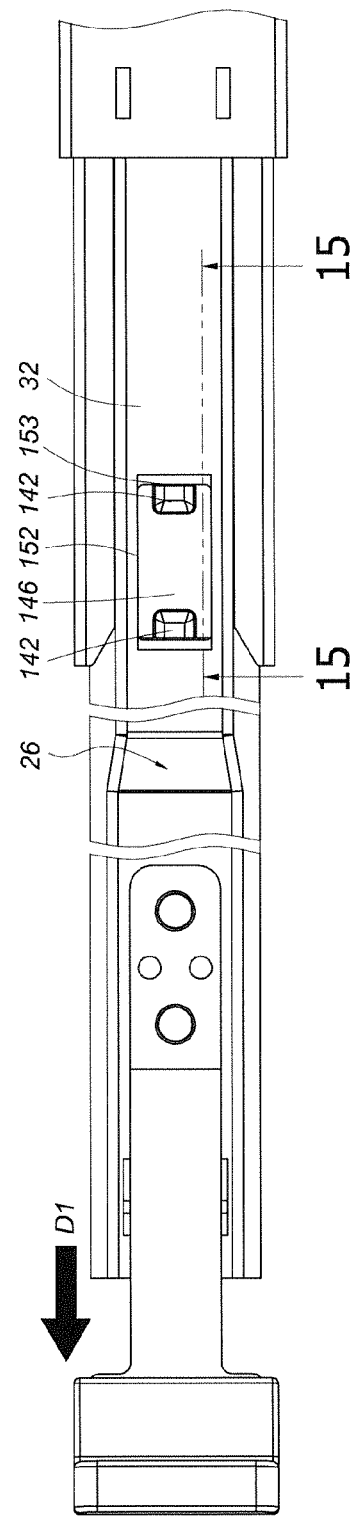

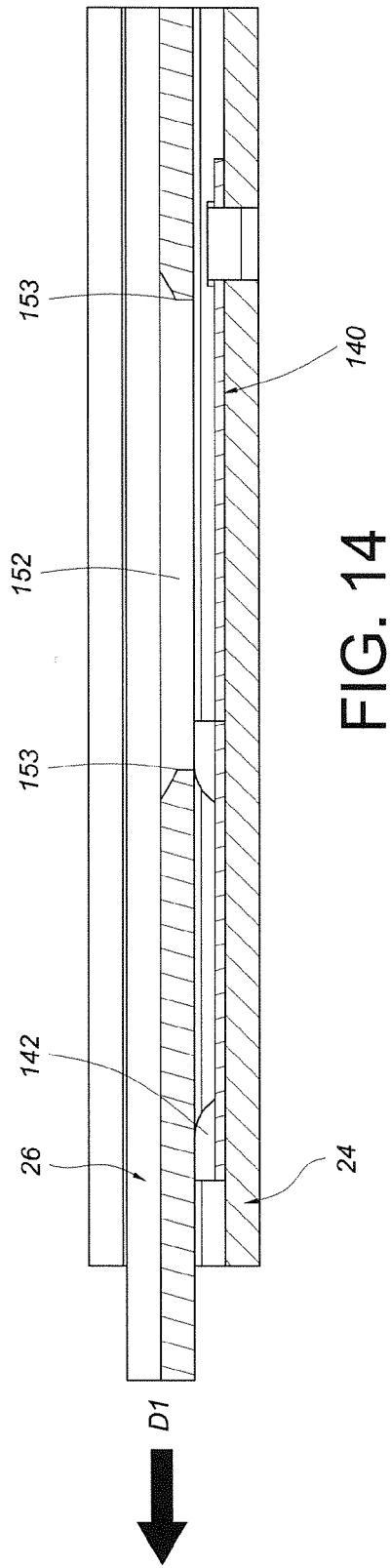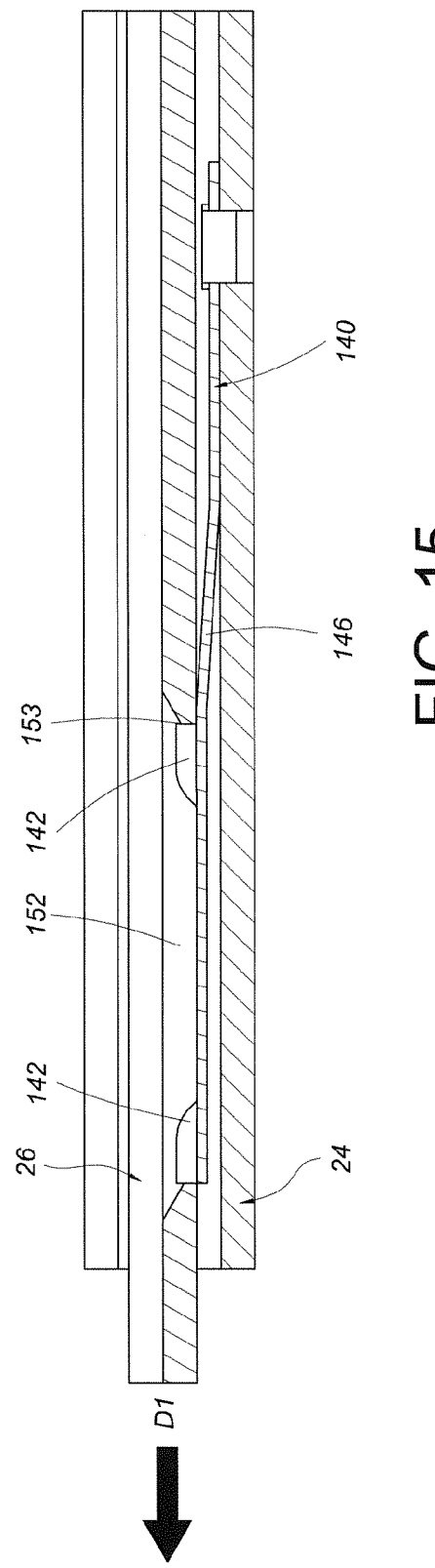

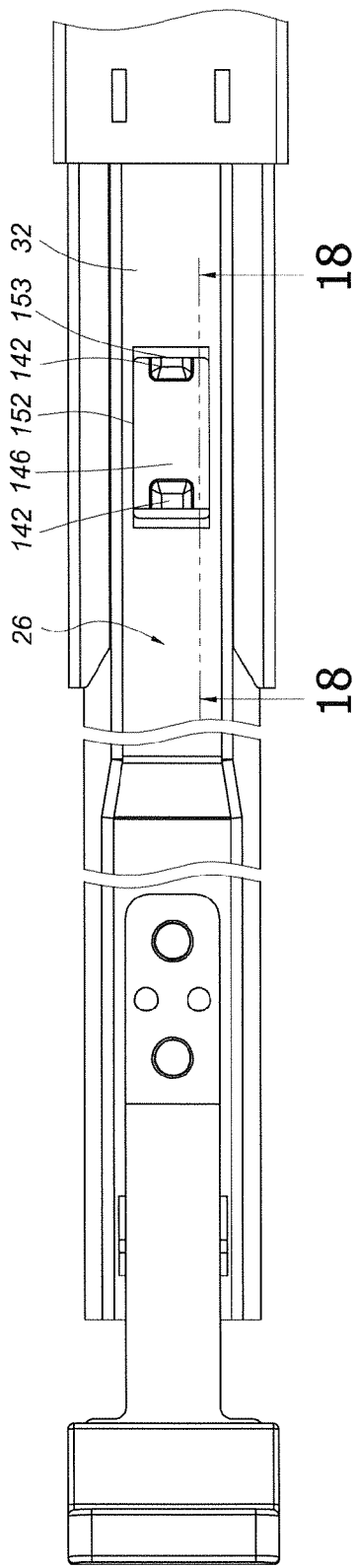
FIG. 16
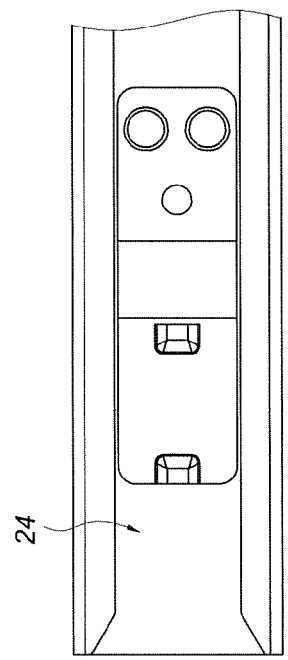
FIG. 17
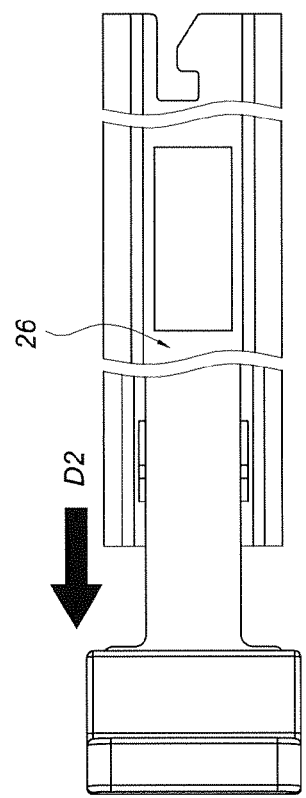

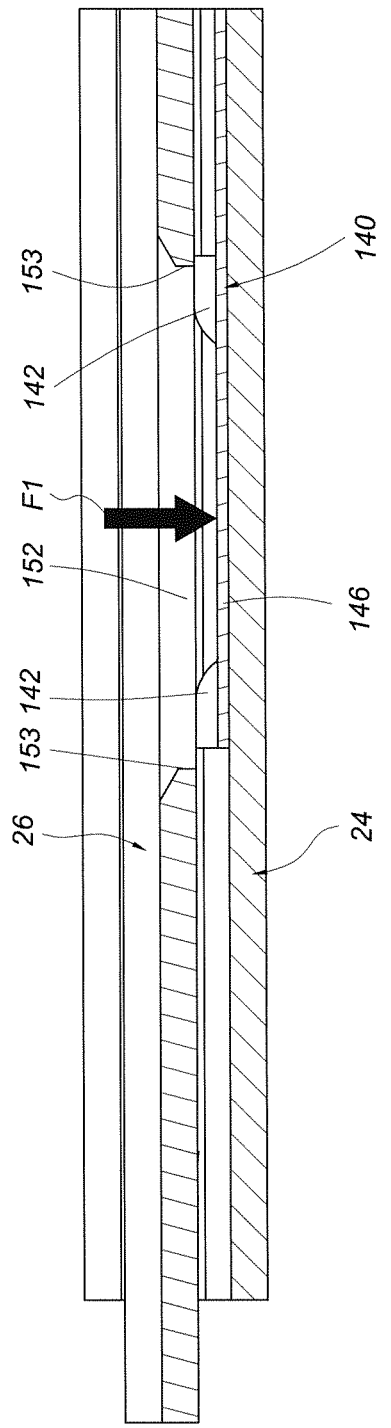

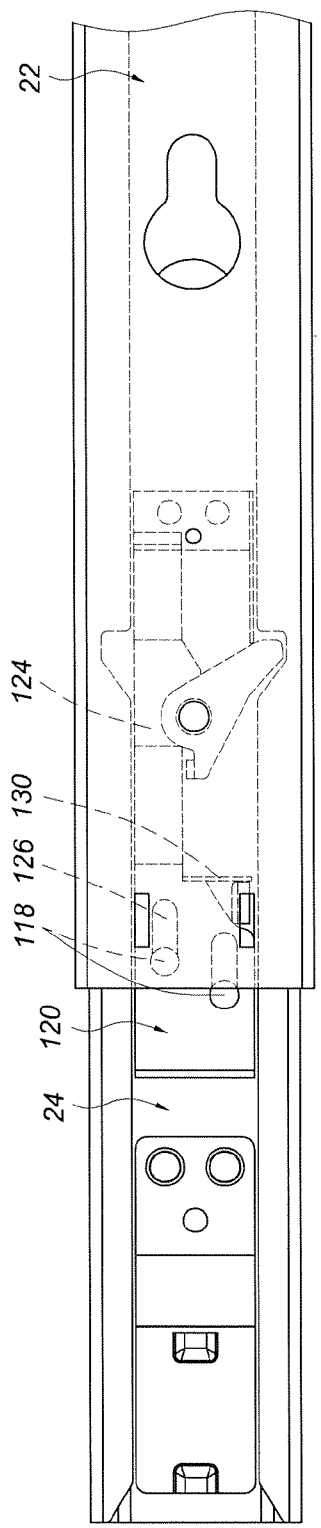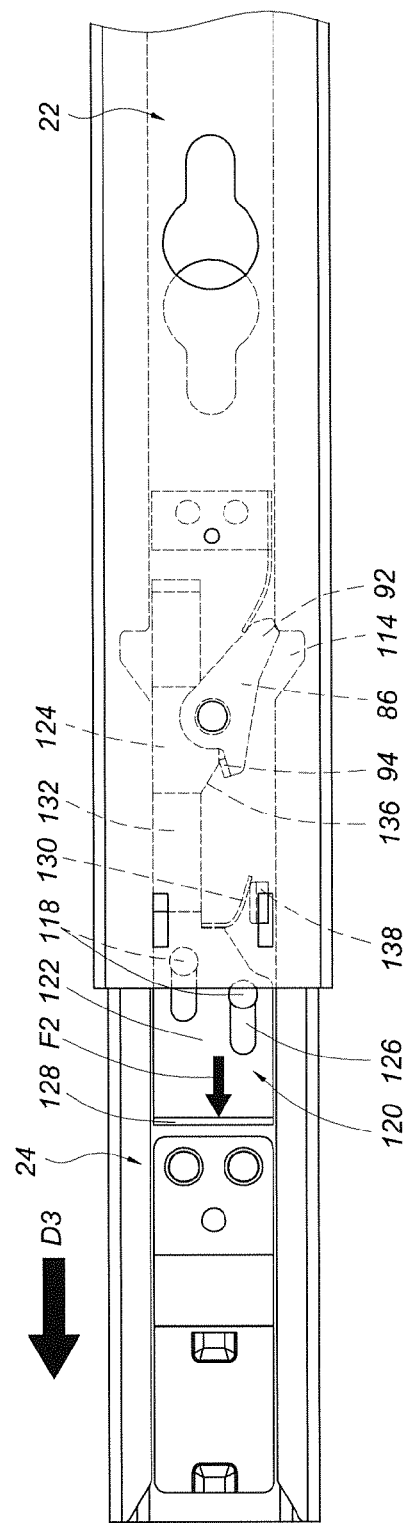

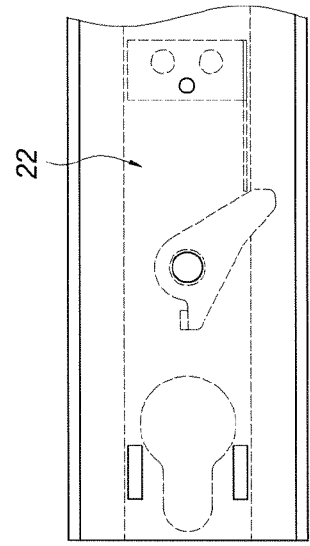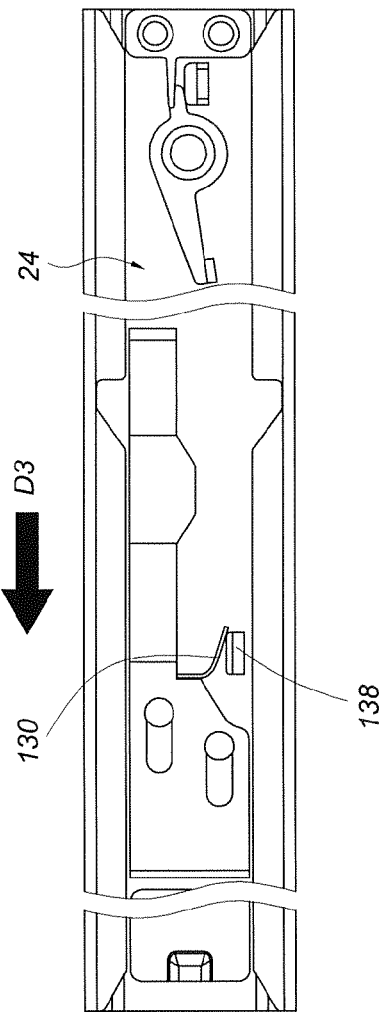
FIG. 19C
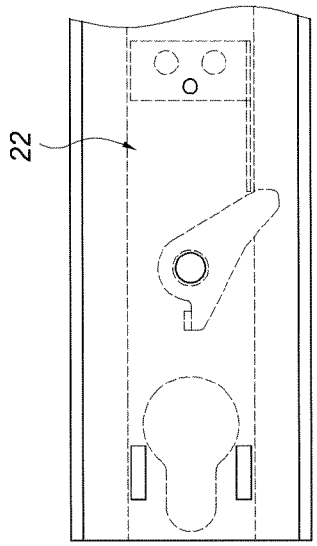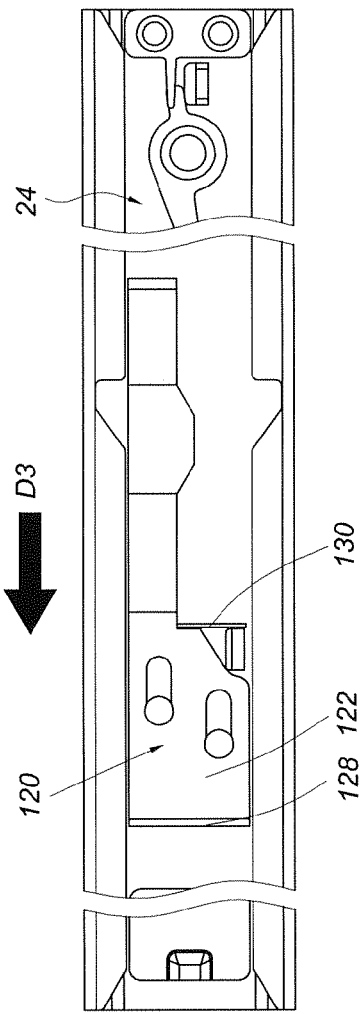
FIG. 19D

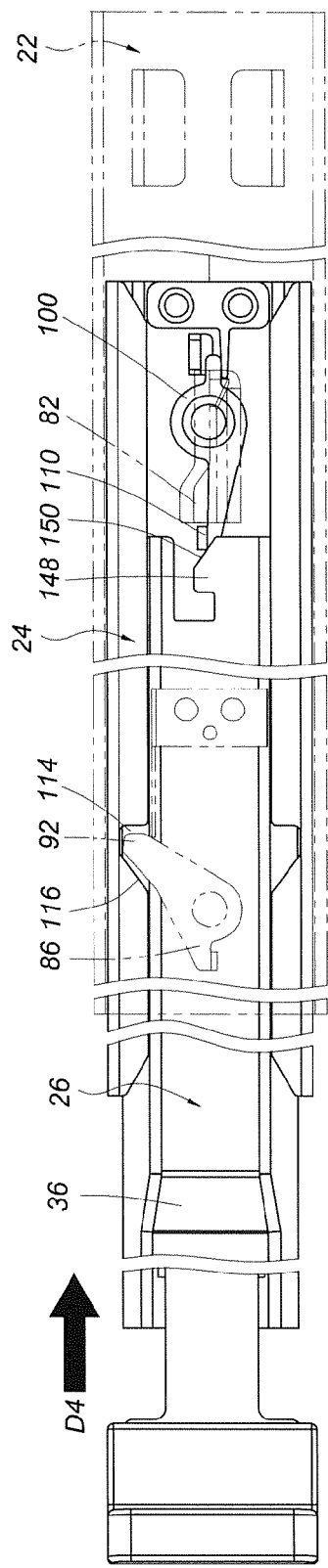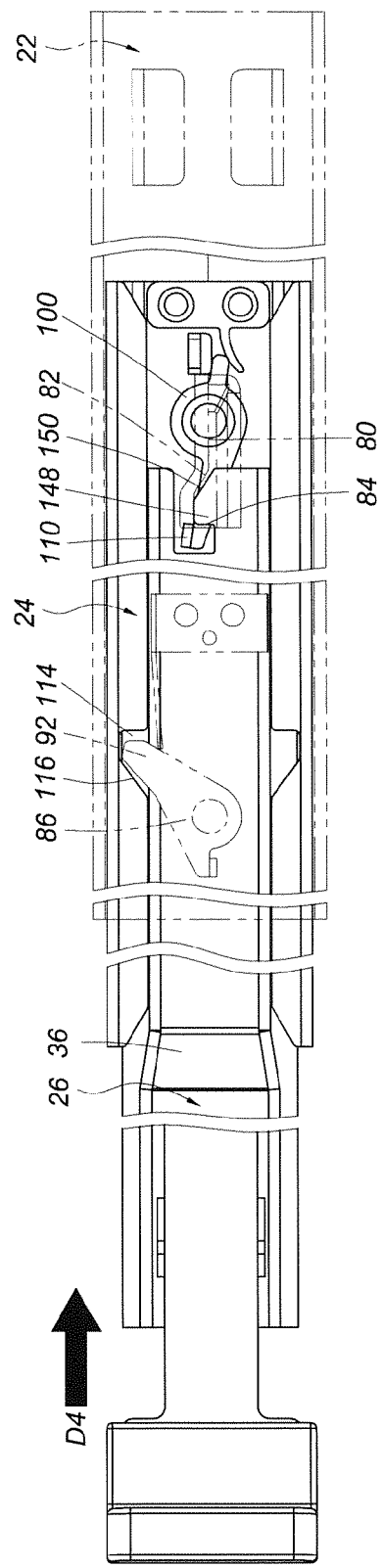

SLIDE RAIL ASSEMBLY

FIELD OF THE INVENTION

The present invention relates to a slide rail assembly and, more particularly, to a slide rail assembly which is applicable to at least two chassis having the same chassis width.

BACKGROUND OF THE INVENTION

Generally, a server chassis in a server system is mounted to a rack via a pair of slide rail assemblies. To support the server chassis, each of the slide rail assemblies is typically composed of two or three sections, or rails. The difference between the two- and the three-section configurations is that the latter can be extended farther to meet specific needs in practice.

Due to their structural design, however, the three-section slide rail assemblies on the market cannot be mounted with two chassis of the same width. For example, U.S. Pat. No. 8,240,790 B2 discloses a slide rail assembly including a first slide (10) and a second slide (20), wherein the second slide (20) has a main body (21), an extending body (23), and a slide post (25). The elements of the slide rail assembly are so arranged that the second slide (20) can overlap the first slide (10) to a large extent in order for the first slide (10) to support the second slide (20) securely. Nonetheless, according to the drawings (e.g., FIG. 1 and FIG. 5) accompanying the specification of the '790 B2 patent, the third main plate (31), or the first plate (311) thereof, of the extending body (23) of the second slide (20) does not extend along the same longitudinal axis as the connection portion (2101) of the second main plate (210) of the main body (21), and because of that, the structural design of the slide rail assembly does not allow two chassis of the same width to be mounted to the assembly. The disclosure of the foregoing patent is incorporated herein by reference.

SUMMARY OF THE INVENTION

The present invention relates to a slide rail assembly suitable for use with at least two chassis of the same chassis width.

According to one aspect of the present invention, a slide rail assembly includes a first rail, a second rail, and a third rail. The first rail includes an upper wall, a lower wall, and a longitudinally extending body extending between the upper wall of the first rail and the lower wall of the first rail. The upper wall of the first rail includes a first bent portion which has a lower surface. The lower wall of the first rail includes a second bent portion which has an upper surface. The second rail is movably connected to the first rail and includes an upper wall, a lower wall, and a longitudinally extending body extending between the upper wall of the second rail and the lower wall of the second rail. The upper wall of the second rail corresponds to the upper wall of the first rail. The lower wall of the second rail corresponds to the lower wall of the first rail. Between the upper wall of the second rail and the longitudinally extending body of the second rail is an upper shoulder which includes an upper surface facing the lower surface of the first bent portion of the first rail. Between the lower wall of the second rail and the longitudinally extending body of the second rail is a lower shoulder which includes a lower surface facing the upper surface of the second bent portion of the first rail. The third rail is movably connected to the second rail and includes an upper wall, a lower wall, and a first longitudinal portion extending between the upper wall of the third rail and the lower wall of the third rail. The upper wall of the third rail has a first wing while the lower wall of the third rail has a second wing. The first wing of the upper wall of the third rail corresponds to the upper wall of the second rail. The second wing of the lower wall of the third rail corresponds to the lower wall of the second rail. The third rail further includes a second longitudinal portion and a slope portion connected between the first longitudinal portion and the second longitudinal portion.

Preferably, the longitudinally extending body of the second rail further has a side surface, and the second longitudinal portion of the third rail further has a side surface, wherein the two side surfaces lie on substantially the same reference plane.

Preferably, the second longitudinal portion of the third rail is outside the second rail.

Preferably, the slide rail assembly further includes a fixing member and an actuating member, both located at the second rail, with the fixing member having a contact section, and the longitudinally extending body of the second rail further includes a projection corresponding to the contact section. The actuating member is movably connected to the longitudinally extending body of the second rail and includes a contact portion and a tail portion. The tail portion is located between the contact section of the fixing member and the projection of the second rail. The third rail preferably further has a hook portion for engaging with the contact portion of the actuating member. It is also preferable that the third rail further has an inclined guiding surface which is adjacent to the hook portion and configured to push the contact portion of the actuating member when the third rail is displaced in a retracting direction from an opened position. Preferably, the longitudinally extending body of the first rail further includes a guiding portion for guiding the contact portion of the actuating member, wherein the guiding portion includes a horizontal section, a rising section extending from the horizontal section, and a stop wall adjacent to the rising section. Preferably, the slide rail assembly further includes a swing member movably connected to the longitudinally extending body of the first rail and an auxiliary member adjacent to the swing member and having an elastic guiding portion. The swing member has a leg in contact with the elastic guiding portion of the auxiliary member, and one of the upper wall and the lower wall of the second rail has a recess where the leg can enter. The recess further has an inclined surface. After the leg of the swing member enters the recess of the second rail, the inclined surface is able to push the leg of the swing member such that the leg is shifted and moved out of the recess of the second rail. Preferably, the slide rail assembly further includes at least one position-limiting member connected to the second rail and a releasing member mounted to the longitudinally extending body of the second rail. The releasing member includes a movable portion and a disengaging portion. One of the movable portion and the disengaging portion has at least one longitudinal groove corresponding to the position-limiting member. The disengaging portion corresponds to a portion of the swing member. After the leg of the swing member enters the recess of the second rail, the releasing member can be displaced relative to the position-limiting member in order for the disengaging portion of the releasing member to drive the swing member into displacement, thereby moving the leg of the swing member out of the recess of the second rail.

Preferably, the slide rail assembly further includes an engaging member located at the second rail and including a positioning portion, and the first longitudinal portion of the third rail includes an opening corresponding to the positioning portion of the engaging member. Once the third rail is displaced relative to the second rail to a certain position, the positioning portion of the engaging member is engaged with the opening of the third rail and is thereby fixed in position. Preferably, the engaging member has a base plate and an elastic portion bent from the base plate, and the positioning portion is located at the resilient portion.

According to another aspect of the present invention, a slide rail assembly includes a first rail, a second rail, and a third rail. The first rail has a front end portion and a rear end portion and defines a first longitudinal passage. The second rail can be displaced in the first longitudinal passage from a retracted position to an extended position relative to the first rail. The second rail has a front end portion and defines a second longitudinal passage. When the second rail is at the retracted position relative to the first rail, the front end portion of the second rail is in the first longitudinal passage between the front end portion of the first rail and the rear end portion of the first rail. When the second rail is at the extended position relative to the first rail, the front end portion of the second rail has moved beyond the front end portion of the first rail. The third rail can be displaced in the second longitudinal passage of the second rail. The third rail includes a first longitudinal portion, a second longitudinal portion, and a slope portion connected between the first longitudinal portion and the second longitudinal portion. When the third rail has been retracted relative to the second rail to a predetermined position, the first longitudinal portion is in the second longitudinal passage of the second rail, and the slope portion is pressed against the front end portion of the second rail such that the second longitudinal portion is outside the second longitudinal passage of the second rail.

Preferably, the first rail further includes an upper wall, a lower wall, and a longitudinally extending body extending between the upper wall of the first rail and the lower wall of the first rail. The upper wall of the first rail includes a first bent portion while the lower wall of the first rail includes a second bent portion. The longitudinally extending body, the upper wall, the lower wall, the first bent portion, and the second bent portion of the first rail jointly define the first longitudinal passage. Preferably, the second rail further includes an upper wall, a lower wall, and a longitudinally extending body extending between the upper wall of the second rail and the lower wall of the second rail. The upper wall of the second rail includes a first bent portion while the lower wall of the second rail includes a second bent portion. The longitudinally extending body, the upper wall, the lower wall, the first bent portion, and the second bent portion of the second rail jointly define the second longitudinal passage. The upper wall of the second rail corresponds to the upper wall of the first rail. The lower wall of the second rail corresponds to the lower wall of the first rail. Preferably, the first bent portion of the first rail further has a lower surface, the second bent portion of the first rail further has an upper surface, and there is an upper shoulder between the upper wall of the second rail and the longitudinally extending body of the second rail and a lower shoulder between the lower wall of the second rail and the longitudinally extending body of the second rail. The upper shoulder includes an upper surface facing the lower surface of the first bent portion of the first rail. The lower shoulder includes a lower surface facing the upper surface of the second bent portion of the first rail. Preferably, the third rail further includes an upper wall and a lower wall, and the first longitudinal portion of the third rail extends between the upper wall of the third rail and the lower wall of the third rail. The upper wall of the third rail has a first wing, and the lower wall of the third rail has a second wing. The first wing of the upper wall of the third rail corresponds to the upper wall of the second rail. The second wing of the lower wall of the third rail corresponds to the lower wall of the second rail. Preferably, the longitudinally extending body of the second rail further has a side surface, and the second longitudinal portion of the third rail further has a side surface, wherein the two side surfaces lie on substantially the same reference plane.

According to still another aspect of the present invention, a slide rail assembly is applicable to a server system which includes a rack. The slide rail assembly includes a first rail, a second rail, and a third rail. The first rail is mounted to the rack and includes an upper wall, a lower wall, and a longitudinally extending body extending between the upper wall of the first rail and the lower wall of the first rail. The upper wall of the first rail includes a first bent portion which has a lower surface, and the lower wall of the first rail includes a second bent portion which has an upper surface. The second rail is movably connected to the first rail and includes an upper wall, a lower wall, and a longitudinally extending body extending between the upper wall of the second rail and the lower wall of the second rail. The upper wall of the second rail corresponds to the upper wall of the first rail. The lower wall of the second rail corresponds to the lower wall of the first rail. There is an upper shoulder between the upper wall of the second rail and the longitudinally extending body of the second rail. The upper shoulder includes an upper surface facing the lower surface of the first bent portion of the first rail. There is also a lower shoulder between the lower wall of the second rail and the longitudinally extending body of the second rail. The lower shoulder includes a lower surface facing the upper surface of the second bent portion of the first rail. The third rail is movably connected to the second rail and includes an upper wall, a lower wall, and a first longitudinal portion extending between the upper wall of the third rail and the lower wall of the third rail. The upper wall of the third rail has a first wing while the lower wall of the third rail has a second wing. The first wing of the upper wall of the third rail corresponds to the upper wall of the second rail. The second wing of the lower wall of the third rail corresponds to the lower wall of the second rail. The third rail further includes a second longitudinal portion and a slope portion connected between the first longitudinal portion and the second longitudinal portion.

Preferably, the server system further includes a first chassis and a second chassis. One lateral side of the first chassis is mounted to the second rail, and one lateral side of the second chassis is mounted to the second longitudinal portion of the third rail. The first chassis and the second chassis have the same chassis width.

Preferably, the second longitudinal portion of the third rail is outside the second rail.

One of the advantageous features of implementing the present invention is that the slide rail assembly includes a second rail and a third rail which are longitudinally displaceable relative to a first rail. Moreover, the second rail includes a longitudinally extending body having a side surface, and the third rail includes a first longitudinal portion, a second longitudinal portion having a side surface, and a slope portion connected between the first longitudinal portion and the second longitudinal portion. The slope portion is so arranged that the side surface of the second longitudinal portion of the third rail lies on substantially the same reference plane as the side surface of the longitudinally extending body of the second rail.

BRIEF DESCRIPTION OF THE DRAWINGS

The invention as well as a preferred mode of use and the advantages thereof will be best understood by referring to the following detailed description of some illustrative embodiments in conjunction with the accompanying drawings, in which:

FIG. 11A schematically shows how the hook portion of the third rail of the slide rail assembly in an embodiment of the present invention is engaged with the contact portion of the actuating member;

FIG. 11B schematically shows how the second rail of the slide rail assembly in FIG. 11A is synchronously driven by the third rail, or more specifically by the hook portion of the third rail which is engaged with the contact portion of the actuating member;

FIG. 11C is a schematic drawing in which the second rail of the slide rail assembly in FIG. 11A has been driven to a certain position where the contact portion of the actuating member is disengaged from the hook portion of the third rail under the guidance of the guiding portion of the first rail;

FIG. 11D is a schematic drawing in which the second rail of the slide rail assembly in FIG. 11A has been driven to a predetermined position where the contact portion of the actuating member is blocked by the stop wall of the guiding portion of the first rail;

FIG. 12 schematically shows how the third rail of the slide rail assembly in FIG. 11A is further displaced in the opening direction;

FIG. 13 is a schematic drawing in which the third rail of the slide rail assembly in FIG. 11A has been further displaced in the opening direction such that the opening of the third rail corresponds to the engaging member;

FIG. 14 is a schematic sectional view taken along line 14-14 in FIG. 12;

FIG. 15 is a schematic sectional view taken along line 15-15 in FIG. 13;

FIG. 16 is a schematic drawing in which the third rail of the slide rail assembly in FIG. 11A is at an opened position;

FIG. 17 is a schematic drawing in which the third rail of the slide rail assembly in FIG. 11A has been detached;

FIG. 18 is a schematic sectional view taken along line 18-18 in FIG. 16, showing a force being applied to the elastic portion of the engaging member;

FIG. 19A is a schematic drawing in which the second rail of the slide rail assembly in an embodiment of the present invention is at an opened position;

FIG. 19B schematically shows how the releasing member of the slide rail assembly in FIG. 19A is pulled to move the leg of the swing member out of the recess of the second rail;

FIG. 19C schematically shows how the second rail of the slide rail assembly in FIG. 19A is detached from the first rail;

FIG. 19D schematically shows how the flexible element of the slide rail assembly in FIG. 19A drives the releasing member back to its initial state after the second rail is detached from the first rail;

FIG. 20A schematically shows how the inclined guiding surface of the third rail of the slide rail assembly in an embodiment of the present invention pushes the contact portion of the actuating member while the third rail is displaced in a retracting direction;

FIG. 20B schematically shows how the contact portion of the actuating member of the slide rail assembly in FIG. 20A is pushed by the inclined guiding surface of the third rail and hence moved away from the stop wall of the guiding portion of the first rail;

DETAILED DESCRIPTION OF THE INVENTION

Figure 1:
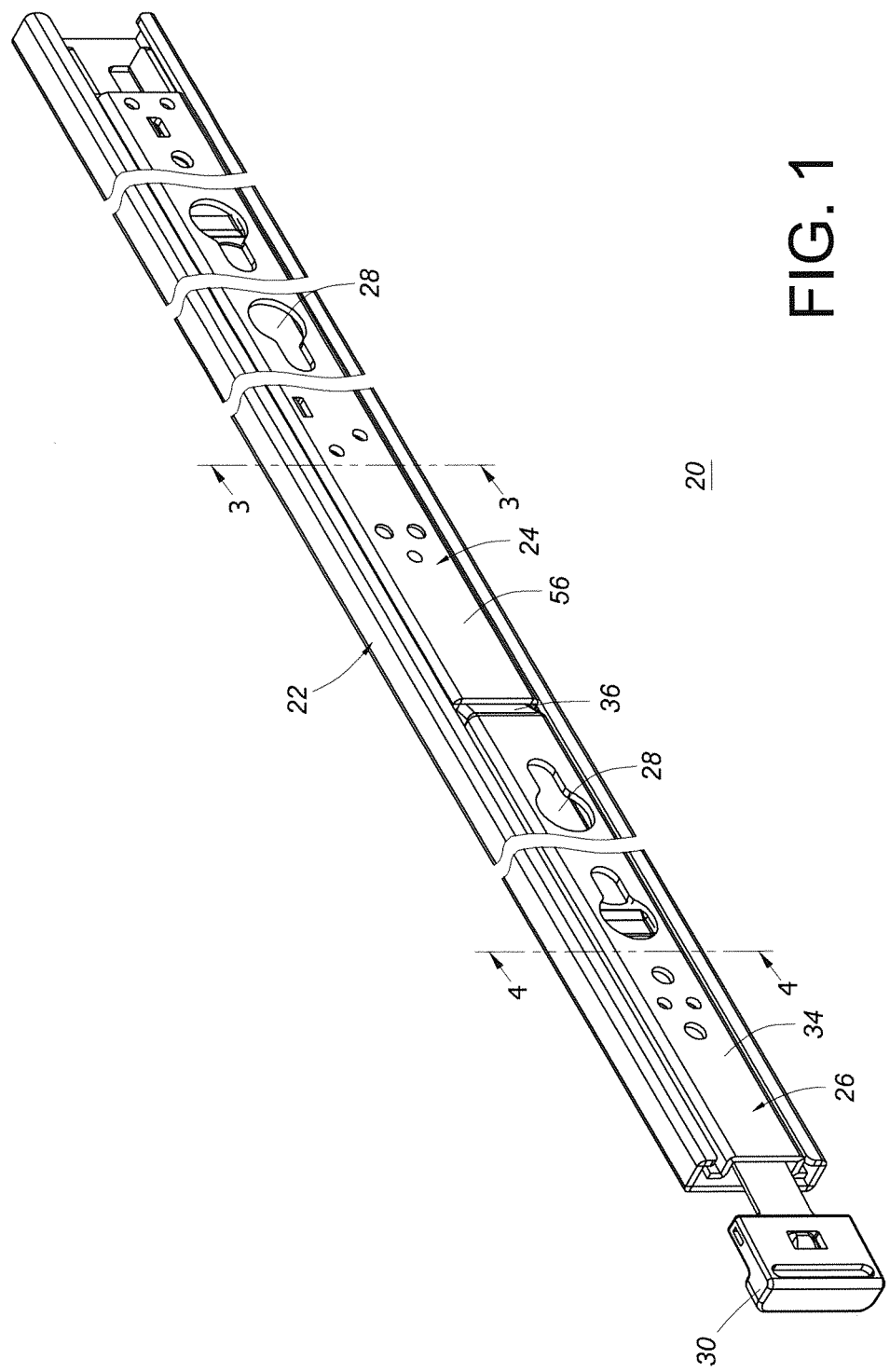
FIG. 1 is a perspective view of the slide rail assembly in an embodiment of the present invention.

Referring to FIG. 1, the slide rail assembly 20 in an embodiment of the present invention includes a first rail 22, a second rail 24, and a third rail 26, which three rails are depicted in FIG. 1 as in a retracted state. The second rail 24 and the third rail 26 can be longitudinally displaced relative to the first rail 22. Each of the second rail 24 and the third rail 26 has at least one mounting portion 28 so that a chassis (e.g., the chassis of a server) can be mounted to each of the second rail 24 and the third rail 26 through the corresponding mounting portion 28. Preferably, an operation member 30 is connected to the third rail 26, allowing an operator to pull the third rail 26 in an opening direction by the operation member 30.

Figure 2:
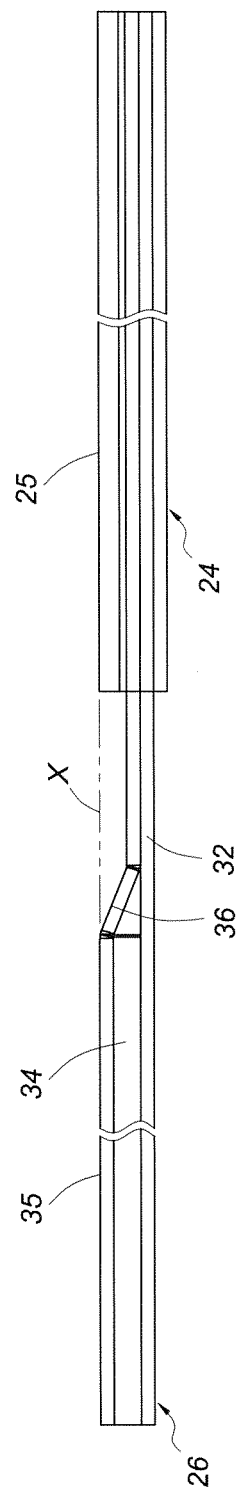
FIG. 2 is a schematic drawing in which the second rail and the third rail in FIG. 1 are assembled together, and in which the third rail has been pulled out a certain distance relative to the second rail.

As shown in FIG. 2, the third rail 26 has a first longitudinal portion 32, a second longitudinal portion 34, and a slope portion 36 connected between the first longitudinal portion 32 and the second longitudinal portion 34. The first longitudinal portion 32 of the third rail 26 is movably connected in the second rail 24. The second longitudinal portion 34 of the third rail 26 is connected to the slope portion 36 and is located outside the second rail 24 due to the slope portion 36.

Figure 4:
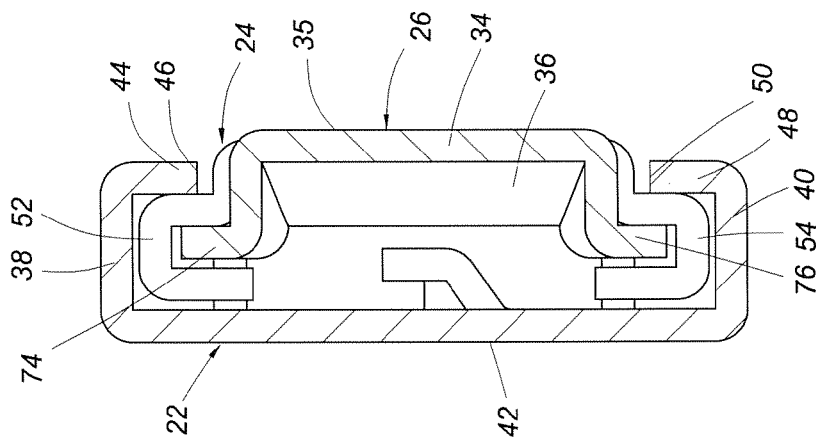
FIG. 4 is a schematic sectional view taken along line 4-4 in FIG. 1.
Figure 3:
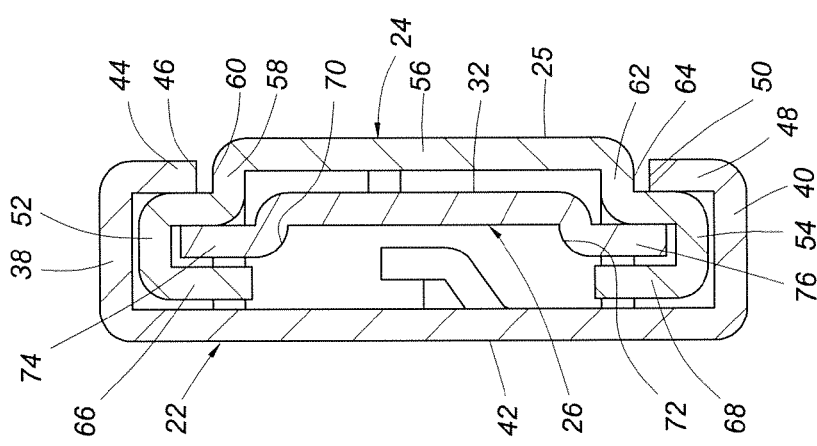
FIG. 3 is a schematic sectional view taken along line 3-3 in FIG. 1.

Referring also to FIG. 3 and FIG. 4, the second rail 24 has a longitudinally extending body 56 with a side surface 25, and the second longitudinal portion 34 of the third rail 26 has a side surface 35. Because of the slope portion 36, the side surface 35 of the second longitudinal portion 34 of the third rail 26 lies on substantially the same reference plane X (see FIG. 2) as the side surface 25 of the longitudinally extending body 56 of the second rail 24. The reference plane X is an imaginary plane and should not be construed as a limitation of the present invention.

FIG. 3 and FIG. 4 are schematic sectional views taken respectively along line 3-3 and line 4-4 in FIG. 1.

The first rail 22 includes an upper wall 38, a lower wall 40, and a longitudinally extending body 42 extending between the upper wall 38 and the lower wall 40. The upper wall 38 of the first rail 22 includes a first bent portion 44. The lower wall 40 of the first rail 22 includes a second bent portion 48. The longitudinally extending body 42, upper wall 38, lower wall 40, first bent portion 44, and second bent portion 48 of the first rail 22 jointly define a first longitudinal passage 23. In addition, the first bent portion 44 has a lower surface 46, and the second bent portion 48 has an upper surface 50.

The second rail 24 is movably connected to the first rail 22 and can be displaced in the first longitudinal passage 23 of the first rail 22. The second rail 24 includes an upper wall 52, a lower wall 54, and a longitudinally extending body 56 extending between the upper wall 52 and the lower wall 54. The upper wall 52 of the second rail 24 corresponds to the upper wall 38 of the first rail 22. The lower wall 54 of the second rail 24 corresponds to the lower wall 40 of the first rail 22. The upper wall 52 of the second rail 24 further has a first bent portion 66 corresponding and adjacent to the longitudinally extending body 42 of the first rail 22. The lower wall 54 of the second rail 24 also has a second bent portion 68 corresponding and adjacent to the longitudinally extending body 42 of the first rail 22. The longitudinally extending body 56, upper wall 52, lower wall 54, first bent portion 66, and second bent portion 68 of the second rail 24 jointly define a second longitudinal passage 29.

There is an upper shoulder 58 at the connecting portion between the upper wall 52 and the longitudinally extending body 56 of the second rail 24. The upper shoulder 58 of the second rail 24 includes an upper surface 60 facing the lower surface 46 of the first bent portion 44 of the first rail 22. Similarly, there is a lower shoulder 62 at the connecting portion between the lower wall 54 and the longitudinally extending body 56 of the second rail 24. The lower shoulder 62 of the second rail 24 includes a lower surface 64 facing the upper surface 50 of the second bent portion 48 of the first rail 22.

The third rail 26 is movably connected to the second rail 24 and can be displaced in the second longitudinal passage 29 of the second rail 24. More specifically, it is the first longitudinal portion 32 of the third rail 26 that can be displaced in the second longitudinal passage 29 of the second rail 24. The second longitudinal portion 34 of the third rail 26 is outside the second longitudinal passage 29 of the second rail 24 due to the slope portion 36. The third rail 26 includes an upper wall 70 and a lower wall 72 between which the first longitudinal portion 32 extends. The upper wall 70 of the third rail 26 has a first wing 74 while the lower wall 72 of the third rail 26 has a second wing 76. The first wing 74 of the upper wall 70 of the third rail 26 corresponds to the upper wall 52 of the second rail 24. The second wing 76 of the lower wall 72 of the third rail 26 corresponds to the lower wall 54 of the second rail 24.

As mentioned previously, the side surface 35 of the second longitudinal portion 34 of the third rail 26 lies on substantially the same reference plane X as the side surface 25 of the second rail 24 (see FIG. 2). Therefore, in the sectional view of FIG. 4, the side surface 35 of the second longitudinal portion 34 of the third rail 26 and the side surface 25 of the longitudinally extending body 56 of the second rail 24 are almost in line with each other. In addition, the slope portion 36 of the third rail 26 can be pressed against the second rail 24 (as can be seen more clearly in FIG. 1).

Figure 5:
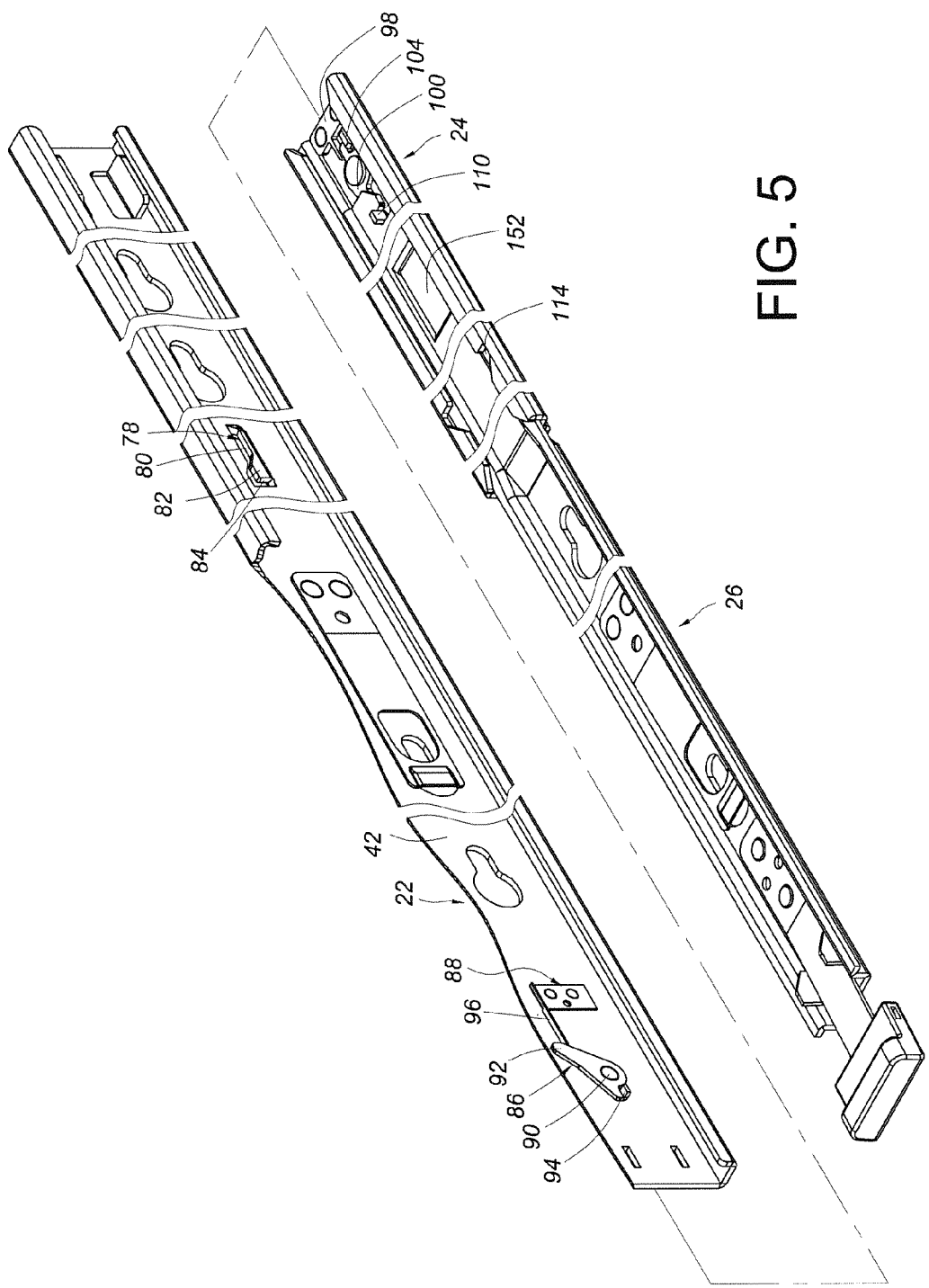
FIG. 5 is a schematic exploded view of the first rail and the assembled second and third rails of the slide rail assembly in an embodiment of the present invention.

In FIG. 5, the first rail 22 is separate from the assembled second and third rails 24 and 26. The first rail 22 has a front end portion 31a and a rear end portion 31b opposite the front end portion 31a, and the longitudinally extending body 42 of the first rail 22 further includes a guiding portion 78. Here, the guiding portion 78 is integrally formed with the longitudinally extending body 42 of the first rail 22, but the present invention is not limited to this arrangement. The guiding portion 78 includes a horizontal section 80, a rising section 82 extending from the horizontal section 80, and a stop wall 84 adjacent to the rising section 82. The slide rail assembly further includes a swing member 86 and an auxiliary member 88. The swing member 86 is movably connected to the longitudinally extending body 42 of the first rail 22. Preferably, the swing member 86 is pivotally connected to the longitudinally extending body 42 of the first rail 22 via a first connector 90. The swing member 86 has a leg 92 and a lateral extension 94. The auxiliary member 88 is connected to the longitudinally extending body 42 of the first rail 22 and is adjacent to the swing member 86. The auxiliary member 88 has a longitudinally extending elastic guiding portion 96, and the leg 92 of the swing member 86 is in contact with the elastic guiding portion 96 of the auxiliary member 88.

Figure 6:
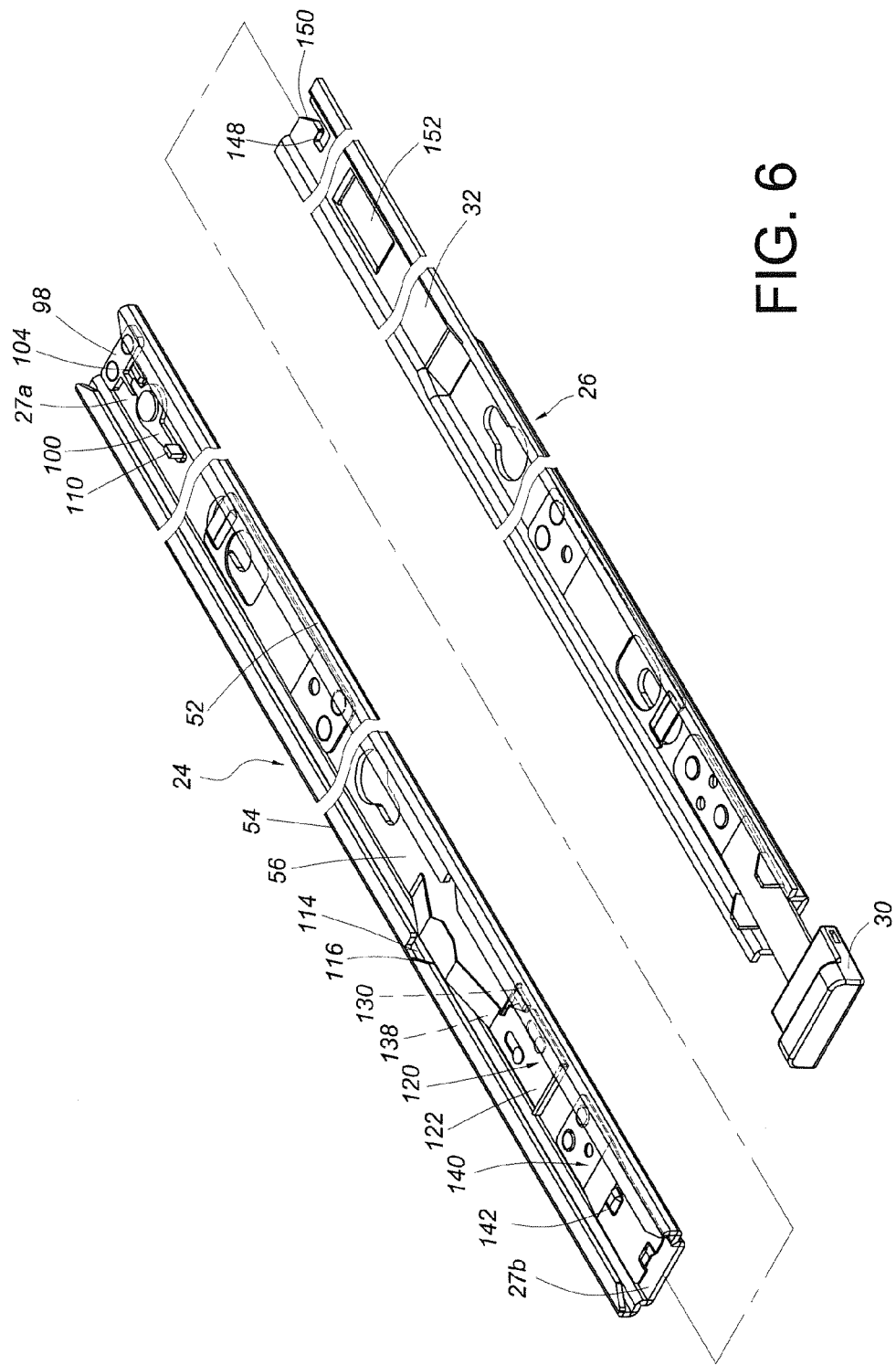
FIG. 6 is a schematic exploded view of the second rail and the third rail of the slide rail assembly in an embodiment of the present invention.

As shown in FIG. 5 and FIG. 6, the second rail 24 corresponds to the first longitudinal passage 23 of the first rail 22 and can be displaced in the first longitudinal passage 23 from a retracted position to an extended position relative to the first rail 22. The longitudinally extending body 56 of the second rail 24 further includes a rear end portion 27a and a front end portion 27b opposite the rear end portion 27a. Referring also to FIG. 1, when the second rail 24 is at the retracted position relative to the first rail 22, the front end portion 27b of the second rail 24 is located within the first longitudinal passage 23 between the front end portion 31a of the first rail 22 and the rear end portion 31b of the first rail 22.

Figure 7:
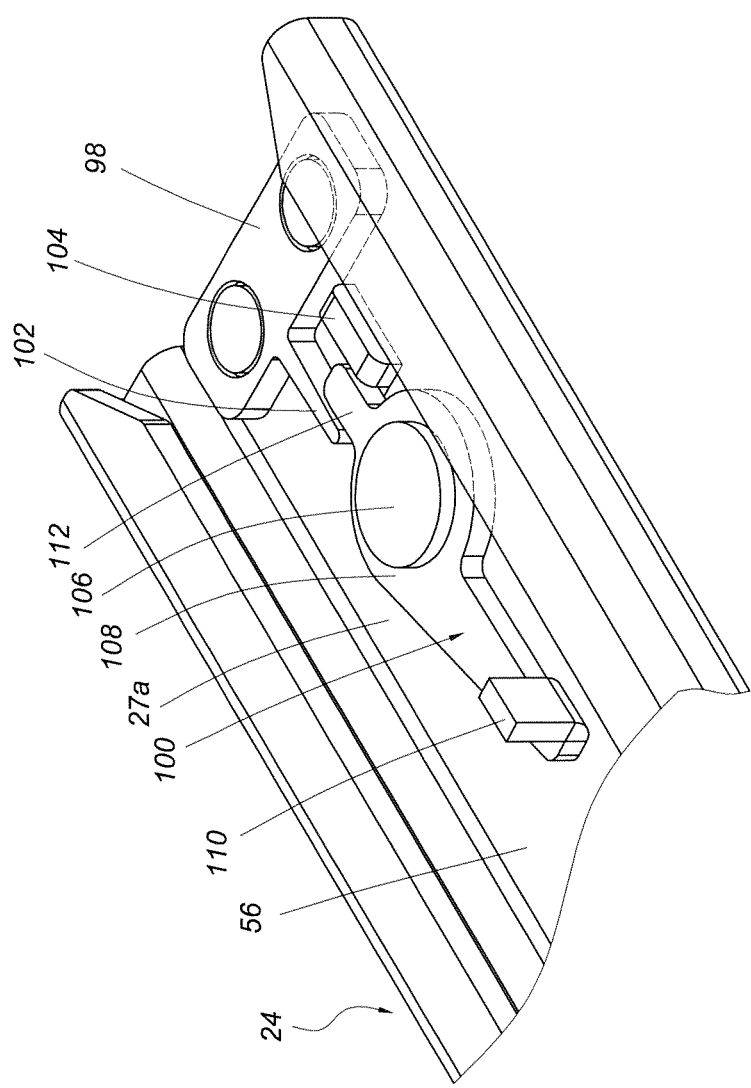
FIG. 7 is a schematic partial enlarged view of the second rail of the slide rail assembly in FIG. 6, showing in particular the arrangement between a fixing member, a projection, and an actuating member.

With continued reference to FIG. 5 and FIG. 6, the slide rail assembly further includes a fixing member 98 and an actuating member 100, both of which are adjacent to the rear end portion 27a of the second rail 24. As shown in FIG. 7, the fixing member 98 has a contact section 102, and the longitudinally extending body 56 of the second rail 24 further includes a projection 104 corresponding in position to the contact section 102. The actuating member 100 is movably connected to the longitudinally extending body 56 of the second rail 24. Preferably, the actuating member 100 is pivotally connected to the longitudinally extending body 56 of the second rail 24 via a second connector 106. The actuating member 100 includes a main body 108, a contact portion 110, and a tail portion 112.

Here, the contact portion 110 extends transversely from the main body 108 so as to be guided by the guiding portion 78 of the longitudinally extending body 42 of the first rail 22, and the tail portion 112 extends longitudinally from the main body 108. However, the configurations of the contact portion 110 and the tail portion 112 are not limited to the above. Please note that the tail portion 112 of the actuating member 100 is situated between the contact section 102 of the fixing member 98 and the projection 104 of the second rail 24. Besides, one of the upper wall 52 and the lower wall 54 of the second rail 24 has a recess 114 where the leg 92 of the swing member 86 of the first rail 22 can enter. The recess 114 has an inclined surface 116.

Figure 8:
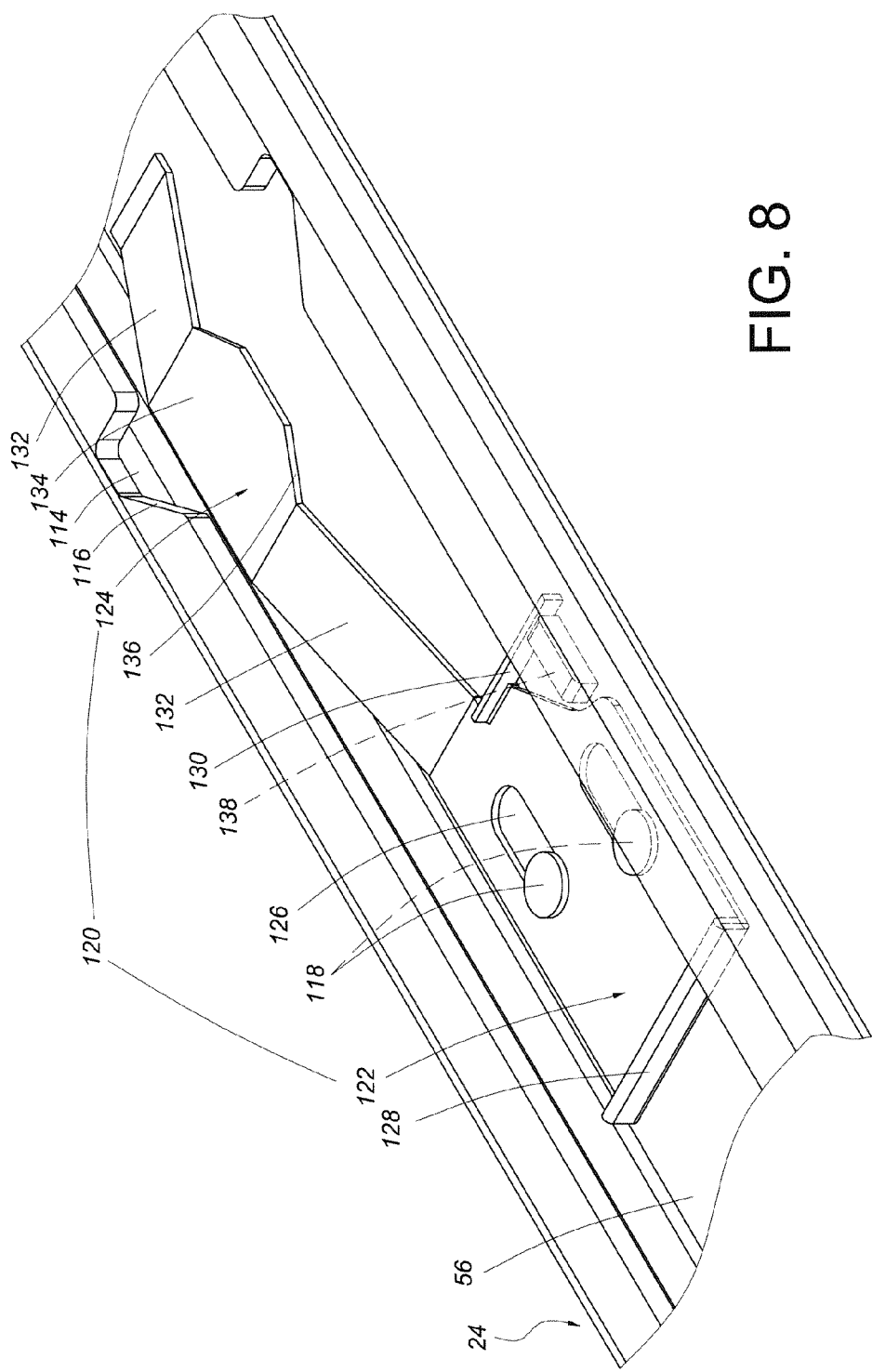
FIG. 8 is a schematic partial enlarged view of the second rail of the slide rail assembly in FIG. 6, showing in particular a releasing member, which is mounted to the second rail and adjacent to a recess.

As shown in FIG. 6 and FIG. 8, the slide rail assembly further includes at least one position-limiting member 118 connected to the second rail 24 and a releasing member 120 mounted to the longitudinally extending body 56 of the second rail 24. The releasing member 120 is adjacent to the recess 114 of the second rail 24.

The releasing member 120 includes a movable portion 122 and a disengaging portion 124 connected to the movable portion 122. In addition, one of the movable portion 122 and the disengaging portion 124 has at least one longitudinal groove 126 corresponding to the position-limiting member 118, an operation portion 128 is connected to one of the movable portion 122 and the disengaging portion 124, and a flexible element 130 is connected to one of the movable portion 122 and the disengaging portion 124. In a preferred but non-limiting embodiment, the movable portion 122 has the at least one longitudinal groove 126, the operation portion 128 is connected to the movable portion 122, and the flexible element 130 is transversely connected to the movable portion 122. Thanks to the structural arrangement between the position-limiting member 118 and the longitudinal groove 126, the movable portion 122 is longitudinally displaced when the operator displaces the operation portion 128.

The disengaging portion 124 has at least one inclined plate 132 and a non-inclined plate 134 connected to the inclined plate 132. In a preferred but non-limiting embodiment, there are two inclined plates 132, the non-inclined plate 134 is connected between the two inclined plates 132, and one of the inclined plates 132 is connected to the movable portion 122 and is bent at an angle with respect to the movable portion 122. The non-inclined plate 134 has a disengaging edge 136, and the longitudinally extending body 56 of the second rail 24 further has a stop block 138. A portion of the flexible element 130 corresponds to and can be pressed against the stop block 138.

Figure 9:
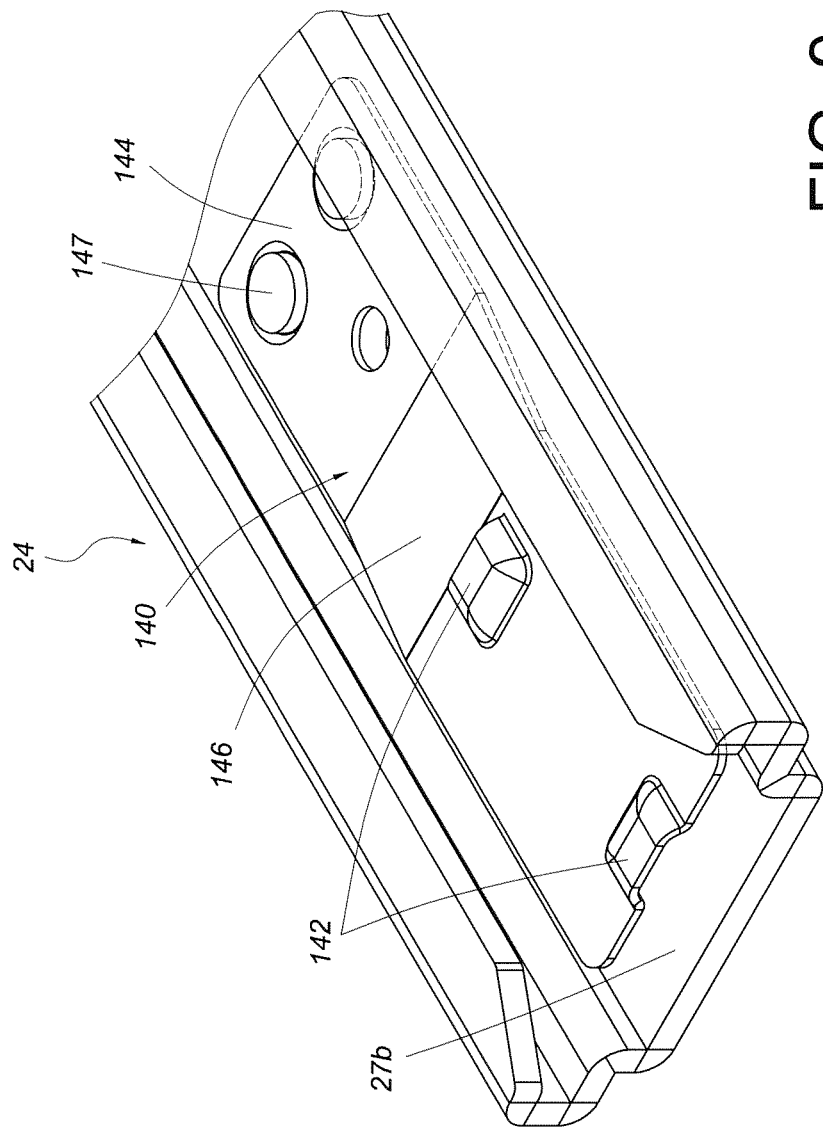
FIG. 9 is a schematic partial enlarged view of the second rail of the slide rail assembly in FIG. 6, showing in particular an engaging member, which is mounted to the second rail at a position adjacent to a front end portion of the second rail.

As shown in FIG. 6 and FIG. 9, the slide rail assembly further includes an engaging member 140 adjacent to the front end portion 27b of the second rail 24. The engaging member 140 includes at least one positioning portion 142. Here, two positioning portions 142 are provided by way of example, wherein each of the positioning portions 142 is a post. Alternatively, the positioning portions 142 can be other similar protuberances, without limitation. In a preferred embodiment, the engaging member 140 has a base plate 144 and an elastic portion 146. The elastic portion 146 is bent from the base plate 144 so as to provide an elastic force. The base plate 144 can be mounted to the second rail 24 via at least one connector 147, wherein the connector 147 can be integrally formed with the second rail 24 or be a separate element mounted to the second rail 24, without limitation. The positioning portions 142 are located at the elastic portion 146.

Figure 10:
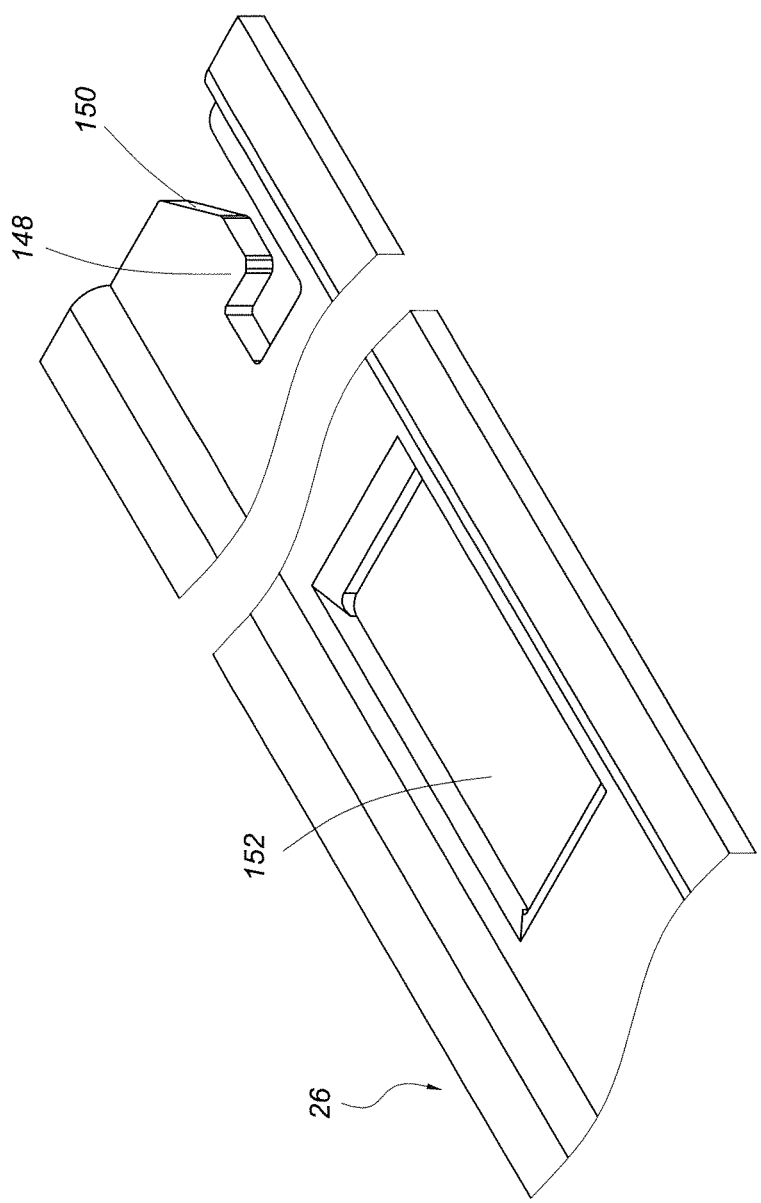
FIG. 10 is a schematic partial enlarged view of the third rail of the slide rail assembly in FIG. 6, showing in particular a hook portion and an inclined guiding surface.

As shown in FIG. 6 and FIG. 10, the third rail 26 has a hook portion 148 and an inclined guiding surface 150 adjacent to the hook portion 148. The hook portion 148 serves to engage with the contact portion 110 of the actuating member 100. In addition, the first longitudinal portion 32 of the third rail 26 includes an opening 152.

FIG. 11~FIG. 15 schematically show operation of the slide rail assembly.

To begin with, referring to FIG. 11A~FIG. 11D, when the operator pulls the third rail 26 in an opening direction D1 by the operation member 30 (see FIG. 11A and FIG. 11B), the hook portion 148 of the third rail 26 correspondingly engages with the contact portion 110 of the actuating member 100 such that the second rail 24 is driven to displace relative to the first rail 22 by the third rail 26. Once the second rail 24 is pulled to a predetermined position relative to the first rail 22, the contact portion 110 of the actuating member 100 begins to be guided by the guiding portion 78 of the first rail 22 and consequently disengages from the hook portion 148 of the third rail 26 (see FIG. 11C and FIG. 11D). More specifically, while the contact portion 110 of the actuating member 100 is displaced from the horizontal section 80 of the guiding portion 78 of the first rail 22 to the rising section 82 of the guiding portion 78, the actuating member 100 rotates by an angle with the tail portion 112 of the actuating member 100 being pressed against the contact section 102 of the fixing member 98 and eventually enables the contact portion 110 of the actuating member 100 to disengage from the hook portion 148 of the third rail 26 (see FIG. 11C). Preferably, at least one of the tail portion 112 of the actuating member 100 and the contact section 102 of the fixing member 98 is made of a flexible material so that the contact portion 110 of the actuating member 100 can easily disengage from the hook portion 148 of the third rail 26. Afterward, as the operator further pulls the third rail 26 in the opening direction D1, the contact portion 110 of the actuating member 100 can be completely separated from the hook portion 148 of the third rail 26 and then blocked by the stop wall 84 of the guiding portion 78 (see FIG. 11D). Moreover, referring to FIG. 11B and FIG. 11C, the leg 92 of the swing member 86 can be guided into and pressed against the recess 114 of the second rail 24 due to the elastic force generated by the elastic guiding portion 96 of the auxiliary member 88. In other words, the recess 114 of the second rail 24 is correspondingly pressed by the leg 92 of the swing member 86.

As shown in FIG. 11D, once the contact portion 110 of the actuating member 100 is blocked by the stop wall 84 of the guiding portion 78 of the first rail 22 and the leg 92 of the swing member 86 enters the recess 114 of the second rail 24, the second rail 24 ceases to be displaced synchronously with the third rail 26. The third rail 26, on the other hand, can be further displaced in the opening direction D1 relative to the second rail 24. It is noted that, when the second rail 24 has been displaced relative to the first rail 22 from the retracted position to an extended position relative to the first rail 22, the front end portion 27b of the second rail 24 must have moved past the front end portion 31a of the first rail 22.

Referring to FIG. 12~FIG. 15, while the third rail 26 is further displaced in the opening direction D1 and has yet to reach a certain position relative to the second rail 24, the elastic portion 146 of the engaging member 140, which can be bent elastically, is pressed between the second rail 24 and the third rail 26 and stores an elastic force (see FIG. 12 and FIG. 14). Once the third rail 26 is displaced to the aforesaid position relative to the second rail 24, the elastic portion 146 releases the stored elastic force such that the positioning portions 142 of the engaging member 140 enter the opening 152 of the first longitudinal portion 32 of the third rail 26 and end up corresponding to and engaged with a wall surface 153 of the opening 152. The third rail 26 at this moment is at an opened position (see FIG. 13 and FIG. 15).

Referring to FIG. 16~FIG. 18, if the operator wishes to detach the third rail 26 from the second rail 24 while the third rail 26 is at the opened position, the operator only has to apply a force F1 (see FIG. 18) to the elastic portion 146 of the engaging member 140 through the opening 152 of the third rail 26, thus moving the positioning portions 142 of the elastic portion 146 away from the opening 152 and out of engagement with the wall surface 153, and the third rail 26 can be pulled out in a detaching direction D2 (see FIG. 17) until detached from the second rail 24.

After detaching the third rail 26, referring to FIG. 19A~FIG. 19D, the operator can further detach the second rail 24 from the first rail 22. To do so, the operator can apply a force F2 (see FIG. 19B) to and thereby pull the operation portion 128 of the releasing member 120 so as to displace the movable portion 122 of the releasing member 120 relative to the position-limiting member 118, thanks to the longitudinal groove 126. Since the disengaging portion 124 of the releasing member 120 is moved at the same time, the disengaging edge 136 correspondingly drives a portion (e.g., the lateral extension 94) of the swing member 86 (with the flexible element 130 subjected to the reaction force of and thus curved by the stop block 138) such that the leg 92 of the swing member 86 is displaced out of the recess 114 of the second rail 24. Then, the operator can pull the second rail 24 in a detaching direction D3 in order to detach the second rail 24 from the first rail 22 (see FIG. 19C). As soon as the operator stops applying the force F2 and hence stops pulling the operation portion 128, the flexible element 130 drives the releasing member 120 back to its initial state (see FIG. 19D).

It can be known from FIG. 16~FIG. 19 that the third rail 26 and the second rail 24 of the slide rail assembly can be detached to facilitate replacement of chassis (e.g., server chassis) or replacement, maintenance, etc. of the slide rail assembly itself.

Figure 20C:
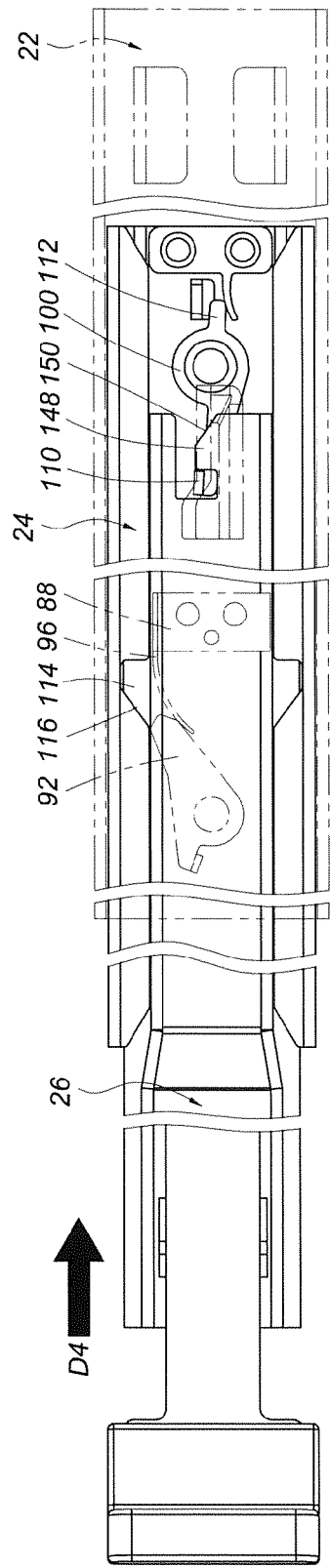
FIG. 20C schematically shows how the leg of the swing member of the slide rail assembly in FIG. 20A is driven out of the recess of the second rail by an inclined surface as the third rail is displaced in the retracting direction.

Referring to FIG. 20A~FIG. 20C, when it is desired to retract the third rail 26 of the slide rail assembly in a retracting direction D4 from the opened position (see FIG. 13), the elastic portion 146 of the engaging member 140 is pressed again (as shown in FIG. 18), and the third rail 26 is displaced in the retracting direction D4 in order for the slope portion 36 of the third rail 26 to push the second rail 24, thereby retracting the third rail 26 and the second rail 24 with respect to the first rail 22. More specifically, when the second rail 24 is displaced to a certain position, the inclined guiding surface 150 of the hook portion 148 of the third rail 26 corresponds to and begins to push the contact portion 110 of the actuating member 100 (see FIG. 20A). Consequently, the contact portion 110 of the actuating member 100 is lifted up by the inclined guiding surface 150 and is eventually moved away from the stop wall 84 of the guiding portion 78 of the first rail 22 (see FIG. 20B). In FIG. 20B, the third rail 26 has been further displaced in the retracting direction D4 and retracted relative to the second rail 24 to a predetermined position where the slope portion 36 is pressed against the front end portion 27b of the second rail 24; as a result, the first longitudinal portion 32 of the third rail 26 is in the second longitudinal passage 29 of the second rail 24 while the second longitudinal portion 34 of the third rail 26 is outside the second longitudinal passage 29 of the second rail 24. In the meantime, the inclined surface 116 of the second rail 24 pushes and thereby shifts the leg 92 of the swing member 86 such that the leg 92 is moved out of the recess 114 (see FIG. 20C). Thus, the contact portion 110 of the actuating member 100 is once again engaged with the hook portion 148 of the third rail 26, meaning the third rail 26 and the second rail 24 have been brought back to the retracted state relative to the first rail 22 (as shown in FIG. 11A).

Figure 21:
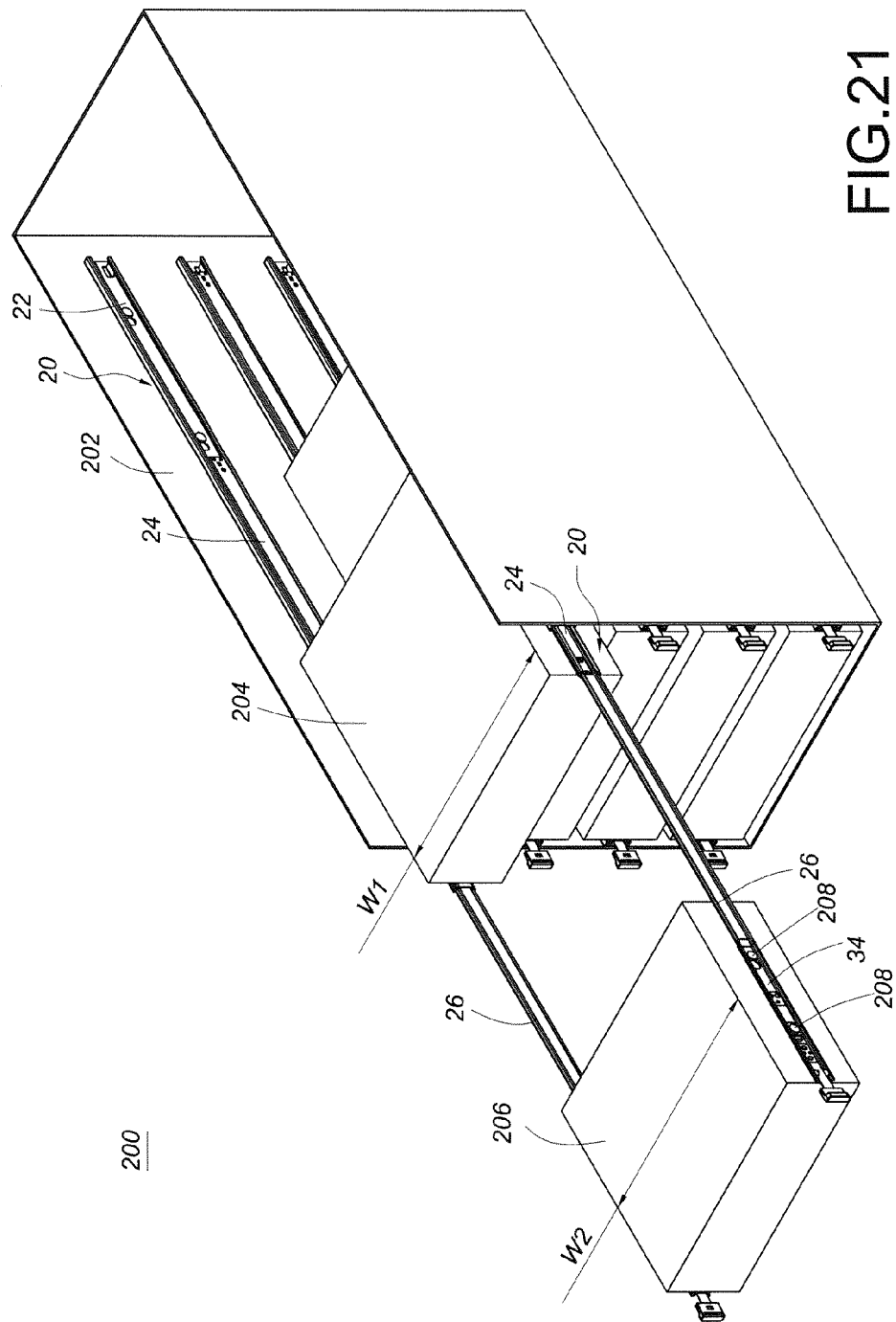
FIG. 21 is a schematic drawing in which the slide rail assembly in an embodiment of the present invention is applied to a server system.

FIG. 21 shows a server system 200 which includes a rack (or cabinet) 202, a first chassis 204, a second chassis 206, and a pair of slide rail assemblies 20. In FIG. 21, the first rail 22 of each slide rail assembly 20 is mounted to the rack 202, and the second rail 24 and the third rail 26 of each slide rail assembly 20 have been pulled relative to the corresponding first rail 22 and are therefore in an opened state. The structure and element arrangement of the slide rail assemblies 20 have been disclosed in the foregoing embodiments and, for the sake of simplicity, will not be described repeatedly.

Each of two opposite lateral sides of the first chassis 204 is mounted to the mounting portion 28 (see FIG. 1) of the longitudinally extending body 56 of the corresponding second rail 24 via at least one mounting member (not shown in the drawing due to limitations of the viewing angle). Similarly, each of two opposite lateral sides of the second chassis 206 is mounted to the mounting portion 28 (see FIG. 1) of the second longitudinal portion 34 of the corresponding third rail 26 via at least one mounting member 208 (the at least one mounting member 208 on one of the two opposite lateral sides is not shown in the drawing due to limitations of the viewing angle).

Referring to FIG. 21 in conjunction with FIG. 1, as the side surface of the longitudinally extending body 56 of the second rail 24 and the side surface of the second longitudinal portion 34 of the third rail 26 in each slide rail assembly 20 lie on substantially the same reference plane, the chassis width W1 of the first chassis 204 can be equal to the chassis width W2 of the second chassis 206. In other words, the second rail 24 and the third rail 26 of each slide rail assembly 20 can be respectively mounted with chassis of the same width.

While the present invention has been disclosed through the preferred embodiments described above, those embodiments are not intended to be restrictive of the present invention. The scope of patent protection sought is defined by the appended claims.

The invention claimed is:

1. A slide rail assembly, comprising:
a first rail comprising an upper wall, a lower wall, and a longitudinally extending body extending between the upper wall of the first rail and the lower wall of the first rail, the upper wall of the first rail comprising a first bent portion, the first bent portion having a lower surface, the lower wall of the first rail comprising a second bent portion, the second bent portion having an upper surface;
a second rail movably connected to the first rail, the second rail comprising an upper wall, a lower wall, and a longitudinally extending body extending between the upper wall of the second rail and the lower wall of the second rail, the upper wall of the second rail corresponding to the upper wall of the first rail, the lower wall of the second rail corresponding to the lower wall of the first rail, there being an upper shoulder between the upper wall of the second rail and the longitudinally extending body of the second rail, the upper shoulder comprising an upper surface facing the lower surface of the first bent portion of the first rail, there being a lower shoulder between the lower wall of the second rail and the longitudinally extending body of the second rail, the lower shoulder comprising a lower surface facing the upper surface of the second bent portion of the first rail; and
a third rail movably connected to the second rail, the third rail comprising an upper wall, a lower wall, and a first longitudinal portion extending between the upper wall of the third rail and the lower wall of the third rail, the upper wall of the third rail having a first wing, the lower wall of the third rail having a second wing, the first wing of the upper wall of the third rail corresponding to the upper wall of the second rail, the second wing of the lower wall of the third rail corresponding to the lower wall of the second rail, wherein the third rail further comprises a second longitudinal portion and a slope portion connected between the first longitudinal portion and the second longitudinal portion.

2. The slide rail assembly of claim 1, wherein the longitudinally extending body of the second rail further has a side surface, the second longitudinal portion of the third rail further has a side surface, and the two side surfaces lie on substantially a same reference plane.

3. The slide rail assembly of claim 1, wherein the second longitudinal portion of the third rail is outside the second rail.

4. The slide rail assembly of claim 1, further comprising a fixing member and an actuating member, the fixing member and the actuating member both being located at the second rail, the fixing member having a contact section, the longitudinally extending body of the second rail further comprising a projection corresponding to the contact section, the actuating member being movably connected to the longitudinally extending body of the second rail, the actuating member comprising a contact portion and a tail portion, the tail portion being located between the contact section of the fixing member and the projection of the second rail, the third rail having a hook portion for engaging with the contact portion of the actuating member.

5. The slide rail assembly of claim 4, wherein the third rail further has an inclined guiding surface adjacent to the hook portion, and the inclined guiding surface is configured to push the contact portion of the actuating member when the third rail is displaced in a retracting direction from an opened position.

6. The slide rail assembly of claim 4, wherein the longitudinally extending body of the first rail further comprises a guiding portion for guiding the contact portion of the actuating member, and the guiding portion comprises a horizontal section, a rising section extending from the horizontal section, and a stop wall adjacent to the rising section.

7. The slide rail assembly of claim 4, further comprising a swing member and an auxiliary member, the swing member being movably connected to the longitudinally extending body of the first rail, while the auxiliary member being adjacent to the swing member and having an elastic guiding portion, wherein the swing member has a leg in contact with the elastic guiding portion of the auxiliary member, and one of the upper wall and the lower wall of the second rail has a recess where the leg can enter.

8. The slide rail assembly of claim 7, wherein the recess further has an inclined surface, and after the leg of the swing member enters the recess of the second rail, the inclined surface is able to push the leg of the swing member such that the leg is shifted and moved out of the recess of the second rail.

9. The slide rail assembly of claim 1, further comprising an engaging member located at the second rail, wherein the engaging member comprises a positioning portion, and the first longitudinal portion of the third rail comprises an opening corresponding to the positioning portion of the engaging member so that, once the third rail is displaced relative to the second rail to a position, the positioning portion of the engaging member is engaged with the opening of the third rail and thereby fixed in position.

10. The slide rail assembly of claim 9, wherein the engaging member has a base plate and an elastic portion bent from the base plate, and the positioning portion is located at the resilient portion.

11. The slide rail assembly of claim 7, further comprising at least one position-limiting member and a releasing member, the at least one position-limiting member being connected to the second rail, while and the releasing member being mounted to the longitudinally extending body of the second rail, the releasing member comprising a movable portion and a disengaging portion, one of the movable portion and the disengaging portion having at least one longitudinal groove corresponding to the position-limiting member, the disengaging portion corresponding to a portion of the swing member, wherein after the leg of the swing member enters the recess of the second rail, displacement of the releasing member relative to the position-limiting member results in the swing member being driven to displace by the disengaging portion of the releasing member such that the leg of the swing member is moved out of the recess of the second rail.

12. A slide rail assembly, comprising:
a first rail having a front end portion and a rear end portion and defining a first longitudinal passage;
a second rail displaceable in the first longitudinal passage from a retracted position to an extended position relative to the first rail, the second rail having a front end portion and defining a second longitudinal passage, wherein when the second rail is at the retracted position relative to the first rail, the front end portion of the second rail is in the first longitudinal passage between the front end portion of the first rail and the rear end portion of the first rail, and when the second rail is at the extended position relative to the first rail, the front end portion of the second rail has moved beyond the front end portion of the first rail; and
a third rail displaceable in the second longitudinal passage of the second rail, the third rail comprising a first longitudinal portion, a second longitudinal portion, and a slope portion connected between the first longitudinal portion and the second longitudinal portion, wherein when the third rail has been retracted relative to the second rail to a predetermined position, the first longitudinal portion is in the second longitudinal passage of the second rail, and the slope portion is pressed against the front end portion of the second rail such that the second longitudinal portion is outside the second longitudinal passage of the second rail.

13. The slide rail assembly of claim 12, wherein the first rail further comprises an upper wall, a lower wall, and a longitudinally extending body extending between the upper wall of the first rail and the lower wall of the first rail; the upper wall of the first rail comprises a first bent portion; the lower wall of the first rail comprises a second bent portion; and the longitudinally extending body, the upper wall, the lower wall, the first bent portion, and the second bent portion of the first rail jointly define the first longitudinal passage.

14. The slide rail assembly of claim 13, wherein the second rail further comprises an upper wall, a lower wall, and a longitudinally extending body extending between the upper wall of the second rail and the lower wall of the second rail; the upper wall of the second rail comprises a first bent portion; the lower wall of the second rail comprises a second bent portion; the longitudinally extending body, the upper wall, the lower wall, the first bent portion, and the second bent portion of the second rail jointly define the second longitudinal passage; the upper wall of the second rail corresponds to the upper wall of the first rail; and the lower wall of the second rail corresponds to the lower wall of the first rail.

15. The slide rail assembly of claim 14, wherein the first bent portion of the first rail further has a lower surface, the second bent portion of the first rail further has an upper surface, there is an upper shoulder between the upper wall of the second rail and the longitudinally extending body of the second rail, the upper shoulder comprises an upper surface facing the lower surface of the first bent portion of the first rail, there is a lower shoulder between the lower wall of the second rail and the longitudinally extending body of the second rail, and the lower shoulder comprises a lower surface facing the upper surface of the second bent portion of the first rail.

16. The slide rail assembly of claim 14, wherein the third rail further comprises an upper wall and a lower wall, the first longitudinal portion of the third rail extends between the upper wall of the third rail and the lower wall of the third rail, the upper wall of the third rail has a first wing, the lower wall of the third rail has a second wing, the first wing of the upper wall of the third rail corresponds to the upper wall of the second rail, and the second wing of the lower wall of the third rail corresponds to the lower wall of the second rail.

17. The slide rail assembly of claim 14, wherein the longitudinally extending body of the second rail further has a side surface, the second longitudinal portion of the third rail further has a side surface, and the two side surfaces lie on substantially a same reference plane.

18. A slide rail assembly applicable to a server system, wherein the server system comprises a rack, the slide rail assembly comprising:
   a first rail mounted to the rack, the first rail comprising an upper wall, a lower wall, and a longitudinally extending body extending between the upper wall of the first rail and the lower wall of the first rail, the upper wall of the first rail comprising a first bent portion, the first bent portion having a lower surface, the lower wall of the first rail comprising a second bent portion, the second bent portion having an upper surface;
   a second rail movably connected to the first rail, the second rail comprising an upper wall, a lower wall, and a longitudinally extending body extending between the upper wall of the second rail and the lower wall of the second rail, the upper wall of the second rail corresponding to the upper wall of the first rail, the lower wall of the second rail corresponding to the lower wall of the first rail, there being an upper shoulder between the upper wall of the second rail and the longitudinally extending body of the second rail, the upper shoulder comprising an upper surface facing the lower surface of the first bent portion of the first rail, there being a lower shoulder between the lower wall of the second rail and the longitudinally extending body of the second rail, the lower shoulder comprising a lower surface facing the upper surface of the second bent portion of the first rail; and
   a third rail movably connected to the second rail, the third rail comprising an upper wall, a lower wall, and a first longitudinal portion extending between the upper wall of the third rail and the lower wall of the third rail, the upper wall of the third rail having a first wing, the lower wall of the third rail having a second wing, the first wing of the upper wall of the third rail corresponding to the upper wall of the second rail, the second wing of the lower wall of the third rail corresponding to the lower wall of the second rail, wherein the third rail further comprises a second longitudinal portion and a slope portion connected between the first longitudinal portion and the second longitudinal portion.

19. The slide rail assembly of claim 18, wherein the server system further comprises a first chassis and a second chassis, the first chassis has a lateral side mounted to the second rail, the second chassis has a lateral side mounted to the second longitudinal portion of the third rail, and the first chassis and the second chassis have a same chassis width.

20. The slide rail assembly of claim 18, wherein the second longitudinal portion of the third rail is outside the second rail.

* * * * *